(12) United States Patent
Oshiyama et al.

(10) Patent No.: US 9,746,878 B2
(45) Date of Patent: Aug. 29, 2017

(54) SEMICONDUCTOR DEVICE AND METHOD OF TESTING SEMICONDUCTOR DEVICE

(71) Applicant: FUJITSU LIMITED, Kawasaki-shi, Kanagawa (JP)

(72) Inventors: Gen Oshiyama, Kawasaki (JP); Takahiro Shikibu, Kawasaki (JP); Osamu Moriyama, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 137 days.

(21) Appl. No.: 14/953,942

(22) Filed: Nov. 30, 2015

(65) Prior Publication Data

US 2016/0154049 A1 Jun. 2, 2016

(30) Foreign Application Priority Data

Dec. 2, 2014 (JP) ................. 2014-243967

(51) Int. Cl.
*G01R 31/30* (2006.01)
*G06F 1/10* (2006.01)
(Continued)

(52) U.S. Cl.
CPC .......... *G06F 1/10* (2013.01); *G01R 31/31715* (2013.01); *G01R 31/318513* (2013.01);
(Continued)

(58) Field of Classification Search
CPC .......... G01R 31/362; G06F 1/04; H04L 7/005
See application file for complete search history.

(56) References Cited

U.S. PATENT DOCUMENTS

2003/0197515 A1  10/2003  Ishigaki
2004/0262747 A1*  12/2004  Kiritani .............. G01R 31/2818
                                                               257/723
(Continued)

FOREIGN PATENT DOCUMENTS

EP          2985615 A1     2/2016
JP          2003-309183    10/2003
(Continued)

OTHER PUBLICATIONS

Extended European Search Report dated Apr. 7, 2016 for corresponding European Patent Application No. 15196545.6, 11 pages.

*Primary Examiner* — Giovanni Astacio-Oquendo
*Assistant Examiner* — Alvaro Fortich
(74) *Attorney, Agent, or Firm* — Fujitsu Patent Center

(57) ABSTRACT

A semiconductor device includes chips, wherein a first chip: an internal circuit; first selectors to output signals from one of first outputs; second selectors to output signals from one of second outputs; first output buffer units to relay/interrupt signals output from one of the first outputs; second output buffer units to relay/interrupt signals output from one of the second outputs; first terminals to output a signal from the respective first output buffer units and belong to a first group in which the first terminals are placed at positions distant by first distances; and second terminals to output a signal from the respective second output buffer units and belong to a second group in which the second terminals are placed at positions distant by second distances and each of the second terminals is placed at a position distant from an adjacent first terminal of the first terminals by third distances.

7 Claims, 8 Drawing Sheets

(51) Int. Cl.
   *H01L 21/66*     (2006.01)
   *G01R 31/3185*   (2006.01)
   *G01R 31/317*    (2006.01)
   *H01L 25/065*    (2006.01)

(52) U.S. Cl.
   CPC ............. *H01L 22/22* (2013.01); *H01L 22/32* (2013.01); *H01L 25/0657* (2013.01); *H01L 2924/0002* (2013.01)

(56) References Cited

U.S. PATENT DOCUMENTS

| | | | |
|---|---|---|---|
| 2005/0160336 A1* | 7/2005 | Oiso | G01B 31/318572 714/726 |
| 2006/0001176 A1 | 1/2006 | Fukaishi et al. | |
| 2008/0104458 A1* | 5/2008 | Uchida | G11C 29/36 714/719 |
| 2008/0238469 A1 | 10/2008 | Ikeda | |
| 2009/0102503 A1 | 4/2009 | Saito | |
| 2011/0309359 A1 | 12/2011 | Saen et al. | |

FOREIGN PATENT DOCUMENTS

| | | |
|---|---|---|
| JP | 2007-35889 | 2/2007 |
| WO | 2007/032184 | 3/2007 |

\* cited by examiner

SEMICONDUCTOR DEVICE AND METHOD OF TESTING SEMICONDUCTOR DEVICE

CROSS-REFERENCE TO RELATED APPLICATION

This application is based upon and claims the benefit of priority of the prior Japanese Patent Application No. 2014-243967, filed on Dec. 2, 2014, the entire contents of which are incorporated herein by reference.

FIELD

The embodiments discussed herein are related to a semiconductor device and a method of testing the semiconductor device.

BACKGROUND

In a system in package (SiP), a plurality of chips are included in a single package.

A related technology is disclosed in Japanese Laid-open Patent Publication No. 2003-309183, International Publication Pamphlet No. WO 2007/032184, or Japanese Laid-open Patent Publication No. 2007-35889.

SUMMARY

According to an aspect of the embodiments, a semiconductor device includes a plurality of chips, each of the plurality of chips includes a plurality of terminals coupled with connection members, wherein a first chip of the plurality of chips includes: an internal circuit; a plurality of first selectors configured to output signals from the internal circuit from one of a plurality of first outputs; a plurality of second selectors configured to output signals from the internal circuit from one of a plurality of second outputs; a plurality of first output buffer units configured to relay or interrupt signals output from one of the plurality of first outputs; a plurality of second output buffer units configured to relay or interrupt signals output from one of the plurality of second outputs; a plurality of first terminals configured to output a signal from the respective plurality of first output buffer units and belong to a first group in which the first terminals are placed at positions distant from each other by first distances; and a plurality of second terminals configured to output a signal from the respective plurality of second output buffer units and belong to a second group in which the second terminals are placed at positions distant from each other by second distances and each of the second terminals is placed at a position distant from an adjacent first terminal of the first terminals by third distances smaller than the first distances.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
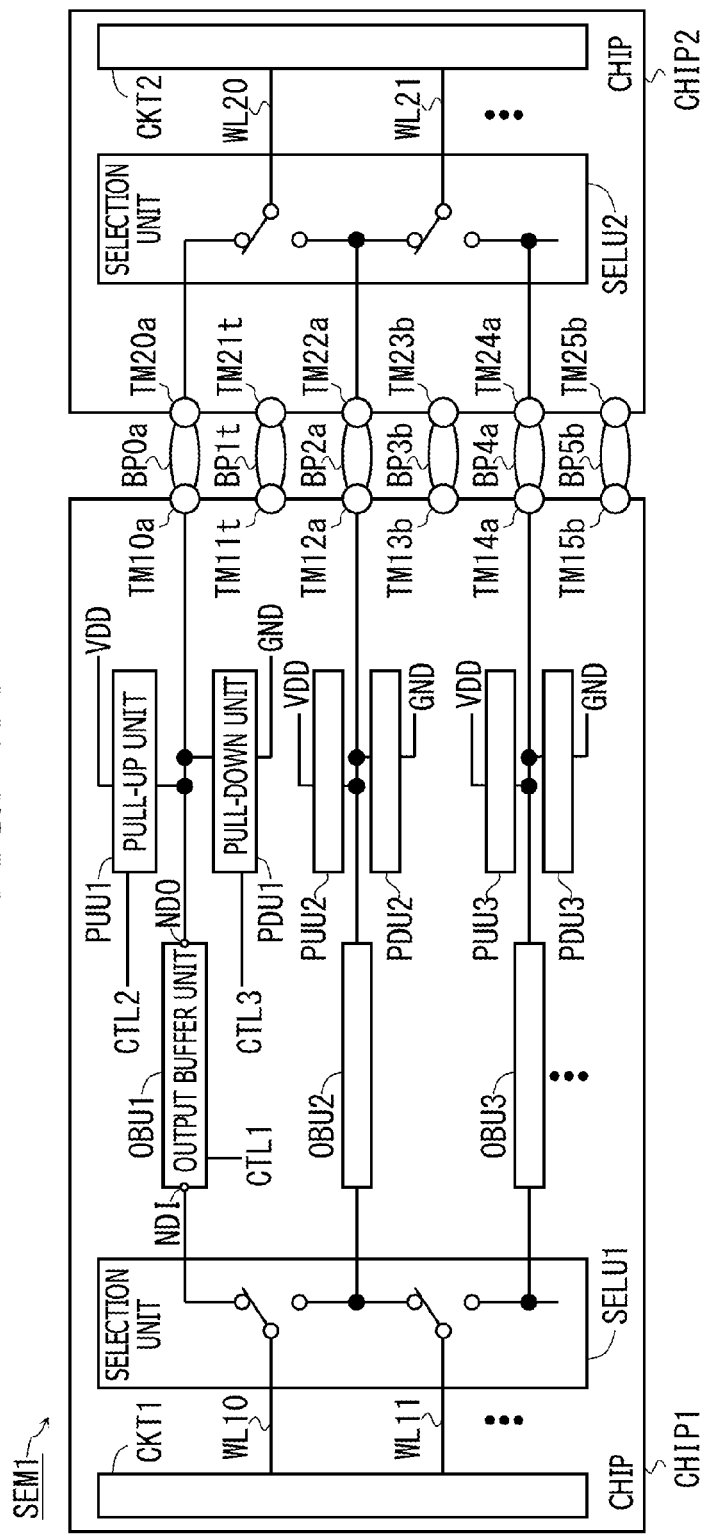
FIG. 1A illustrates an example of a semiconductor device.

Input/output (I/O) terminals of a plurality of chips are mutually bonded with, for example, bumps such as microbumps. Microbumps are used to bond I/O terminals placed at shorter intervals than bumps, thereby enabling many I/O terminals used for inter-chip data transmission to be placed. As for chips with terminals bonded with microbumps, the width of a bus through which data is transmitted between chips is widened, so data is transmitted at a high transmission rate.

When many I/O terminals are placed, a failure may occur in a signal path including I/O terminals and microbumps due to improper microbump manufacturing or another factor. For example, a failure in which a signal path including I/O terminals, microbumps and the like becomes an open state or a failure in which mutually adjacent lines are short-circuited may occur.

If a yield (ratio of non-defective chips) drops due to improper microbump bonding, a SiP cost may increase. A semiconductor device in which a plurality of chips are stacked, for example, a failure recovers by bypassing a failed portion. A semiconductor device includes a backup signal path (also referred to below as a redundant line) and a redundant circuit that executes a switchover to the backup signal path. If, for example, one of a plurality of inter-chip signal paths fails due to a break or the like, the backup signal path is used. The failed signal path is detected by a test circuit incorporated into the semiconductor device or an external test apparatus that tests the semiconductor device.

As for a semiconductor device in which a package substrate and a chip are coupled with solder balls, voltages at solder balls placed at the four corners of the chip are measured to test a connection between the package substrate and the chip.

If any one of a plurality of inter-chip signal paths fails due to a short circuit between mutually adjacent lines, a single redundant line may not be enough to recover from a failure in the inter-chip signal path. If, for example, mutually adjacent lines are short-circuited, the inter-chip signal path is recovered when two redundant lines are used instead of the two short-circuited lines. When two or more redundant lines are used to bypass a failed portion, the size of a redundant circuit that includes a selector to select lines to be used and other elements is increased, so the manufacturing cost of the semiconductor device is increased.

For example, the presence or absence of mutually short-circuited lines is detected by testing an inter-chip connection for each microbump. As the number of microbumps is increased, a test time is increased and the manufacturing cost of the semiconductor device is increased.

The same reference characters as for power supply voltage names are used for power supply lines to which power supply voltages (power supply voltage VDD and ground voltage GND) are transmitted.

FIG. 1A illustrates an example of a semiconductor device. The suffixes a, b, and t of the reference characters assigned to the terminals TM (TM10a, TM11t, TM13b, TM20a, TM21t, TM23b, and the like) and bumps BP (BP0a, BP1t, BP3b, and the like) illustrated in FIG. 1A indicate groups to which the terminals TM and bumps BP belong. For example, terminals TM10a, TM12a, TM14a, TM20a, TM22a, and TM24a and bumps BP0a, BP2a, and BP4a belong to a redundant group A of a plurality of first groups (also referred to below as redundant groups). Terminals TM13b, TM15b, TM23b, and TM25b and bumps BP3b and BP5b belong to a redundant group B of the plurality of first groups. Terminals TM11t and TM21t and a bump BP1t belong to a group T other than the first groups.

The semiconductor device SEM1 may be a system in package (SiP) in which a plurality of chips CHIP (CHIP1 and CHIP2) are included in a single package. For example, the semiconductor device SEM1 has a plurality of chips CHIP (CHIP1 and CHIP2) and bumps BP, such as microbumps, that mutually couple a plurality of terminals TM placed on certain planes of the plurality of chips CHIP. Bumps BP may be an example of connection sections that mutually couple a plurality of terminals TM placed on certain planes of the plurality of chips CHIP.

For example, a terminal TM of the chip CHIP1 is electrically coupled to a terminal TM of the chip CHIP2 through a bump BP. The terminals TM (TM10a, TM11t, TM12a, TM13b, TM14a, TM15b, TM20a, TM21t, TM22a, TM23b, TM24a, and TM25b) are, for example, I/O terminals that are used for data transmission between the chips CHIP1 and CHIP2.

A certain number of terminals TM on each of the plurality of chips CHIP belong to one of a plurality of redundant groups. Each redundant group has at least one of sets of redundant terminals TM (backup terminals TM). In the redundant group A illustrated in FIG. 1A, any one of a set of terminals TM10a and TM20a, a set of terminals TM12a and TM22a, and a set of terminals TM14a and TM24a corresponds to a set of backup terminals TM. The group T is a group in which backup terminals TM are not included and is one of groups other than the redundant groups.

Figure 1B:
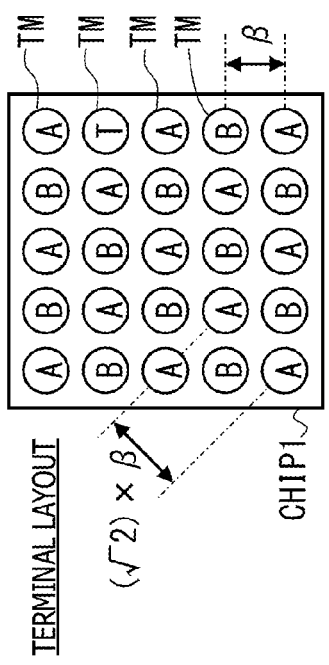
FIG. 1B illustrates an example of a terminal layout.

FIG. 1B illustrates an example of a terminal layout. In FIG. 1B, the terminal layout on the chip CHIP1 is illustrated. The reference characters A and B indicated in terminals TM illustrated in FIG. 1B respectively indicate the redundant groups A and B. The reference character T indicated in a terminal TM illustrated in FIG. 1B indicates another group T (group T other than the redundant groups).

The redundant group A is an example of the first group to which a plurality of first terminals belongs, each first terminal being configured to output a signal from one of a plurality of first output buffer units (output buffer unit OBU1 and the like) and being placed at a position distant from its adjacent first terminal by a first distance, for example, ($\sqrt{2}$)×β. The redundant group B is an example of a second group to which a plurality of second terminals belongs, each second terminal being placed at a position distant from its adjacent second terminal by a second distance, for example, ($\sqrt{2}$)×β, and distant from its adjacent first terminal by a third distance that is shorter than the first distant, for example, β. Each of the plurality of second terminals belonging to the second group outputs a signal from one of a plurality of second output buffer units.

The second distant, for example, an interval between mutually adjacent terminals TM in the redundant group B, may not be equal to the first distance, for example, an interval between mutually adjacent terminals TM in the redundant group A. For example, the first distance and second distance may be equal to each other or may be different from each other.

Each terminal TM is placed on the surface of the chip CHIP1, for example, a surface on which logic circuits that implement the functions of the chip CHIP1 are formed, so that an interval between the terminal TM and its adjacent terminal TM is an interval β or more. For example, the terminals TM are placed in a grid form. The horizontal interval and vertical interval between two adjacent terminals TM placed in a grid form are both the interval β. Terminals TM belonging to the same redundant group of the plurality of redundant groups may be placed at intervals larger than the interval β.

On the top row of the terminal layout illustrated in FIG. 1B, for example, terminals TM belonging to the redundant group A and terminals TM belonging to the redundant group B are alternately placed. On the second row from the top of the terminal layout, a terminal TM belonging to the redundant group B, a terminal TM belonging to the redundant group A, a terminal TM belonging to the redundant group B, a terminal TM belonging to the redundant group A, and a terminal TM belonging to the group T are placed in that order. On the third row and later from the top of the terminal layout, terminals TM belonging to the redundant group A and terminals TM belonging to the redundant group B are alternately placed along the horizontal direction in FIG. 1B and also alternatively placed along the vertical direction.

The interval β corresponds to, for example, an interval between a first terminal TM of the plurality of terminals TM in the redundant group A and a terminal TM that is adjacent to the first terminal TM and is in another redundant group (redundant group B other than the redundant group A). In the terminal layout illustrated in FIG. 1B, an interval between terminals TM adjacent to each other in an oblique direction, for example, an interval between mutually adjacent terminals TM in the redundant group A, is represented by ($\sqrt{2}$)×β, which is larger than the interval β. A plurality of terminals TM in the redundant group A may be placed at intervals larger than the interval β. A plurality of terminals TM in the redundant group B may be placed at intervals larger than the interval β.

With the semiconductor device SEM1, therefore, the probability that two terminals TM belonging to the same redundant group are short-circuited may be smaller than when an interval between mutually adjacent terminals TM belonging to the same redundant group is the interval β. When, for example, the chip CHIP1 and chip CHIP2 are coupled so that their surfaces face each other (flip chip connection), the layout of the terminals TM on the chip CHIP2 may be the same as or similar to the layout obtained by inverting the terminal layout of the terminal layout on the CHIP1 illustrated in FIG. 1B to left and right.

Figure 3:
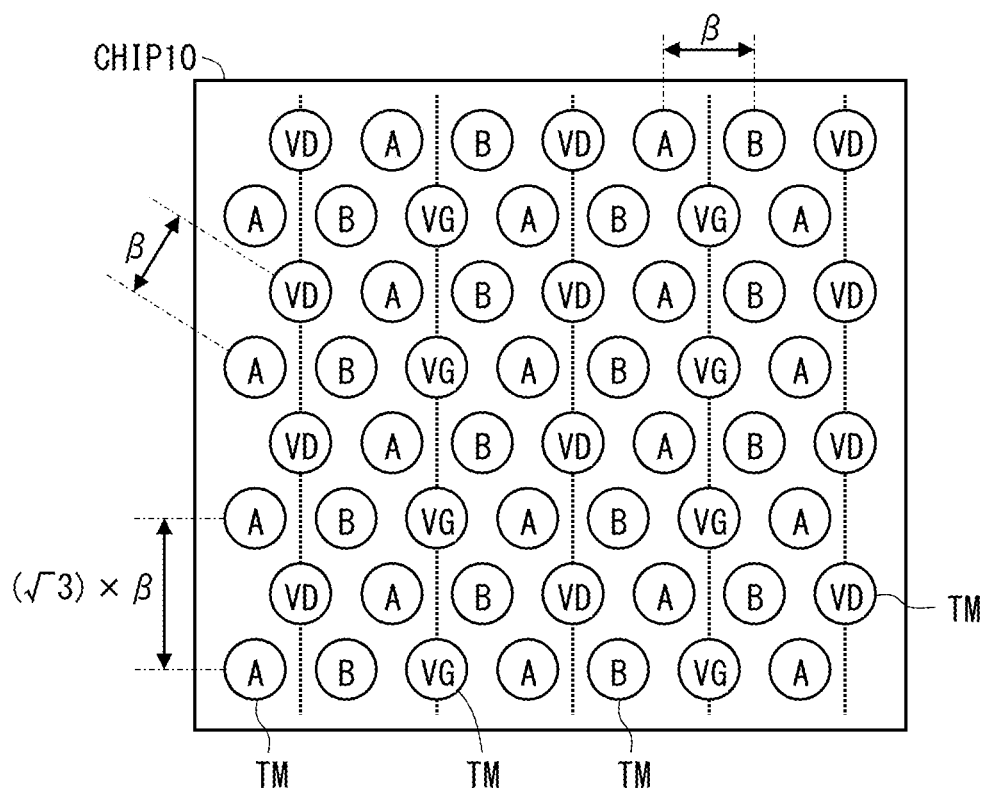
FIG. 3 illustrates an example of a terminal layout on a chip.

When the terminals TM on the chip CHIP1 and the terminals TM on the chip CHIP2 are coupled by using through electrodes that pass through the substrate of the relevant chip CHIP, the layout of the terminals TM on the chip CHIP2 may be the same as or similar to the layout of the terminals TM on the chip CHIP1. Each through electrode is, for example, an electrode that passes through the substrate of the relevant chip CHIP. If, for example, the chip CHIP2 has through electrodes, the chip CHIP1 and chip CHIP2 are coupled with the front surface of the chip CHIP1 and the back surface of the chip CHIP2 facing each other. A plurality of chips CHIP may be placed in the horizontal direction. The terminal layout on the chip CHIP is not limited to this example. For example, the terminals TM may be placed in a staggered form as illustrated in FIG. 3.

Each chip CHIP (CHIP1 or CHIP2) has an internal circuit CKT (CKT1 or CKT2) and a selection unit SELU (SELU1 or SELU2), which is provided for each of a plurality of redundant groups. The chip CHIP1 has output buffer units OBU (OBU1, OBU2, and OBU3), pull-up units PUU (PUU1, PUU2, and PUU3), and pull-down units PDU (PDU1, PDU2, and PDU3). A selection unit SELU that correspond to a redundant group other than the redundant group A, for example, the redundant group B, output buffer units OBU, pull-up units PUUs, and pull-down units PDU are provided.

The internal circuit CKT1 is part of logic circuits that implement the functions of the chip CHIP1, and the internal circuit CKT2 is part of logic circuits that implement the functions of the chip CHIP2. For example, the internal circuit CKT1 outputs a signal to the selection unit SELU1 through a signal line WL10 or the like. The internal circuit CKT1 outputs a signal to a selection unit SELU corresponding to the redundant group B or the like. The internal circuit CKT2 receives a signal from the selection unit SELU2 through a signal line WL20 or the like. The internal circuit CKT2 receives a signal from a selection unit SELU corresponding to the redundant group B or the like.

The selection units SELU (SELU1 and SELU2) select a terminal TM that transmits a signal from a plurality of terminals TM. For example, the selection units SELU1 and SELU2 select a signal path between the chips CHIP1 and CHIP2. For example, a signal path between the signal line WL10 in the chip CHIP1 and the signal line WL20 in the chip CHIP2, a signal path between the signal line WL11 in the chip CHIP1 and the signal line WL21 in the chip CHIP2, and the like are determined.

As a signal path between the signal lines WL10 and WL20, the selection unit SELU selects, for example, one of a signal path including the terminal TM10a, bump BP0a, terminal TM20a, and the like and a signal path including the terminal TM12a, bump BP2a, terminal TM22a, and the like. As a signal path between the signal lines WL11 and WL21, the selection unit SELU selects one of a signal path including the terminal TM12a, bump BP2a, terminal TM22a, and the like and a signal path including the terminal TM14a, bump BP4a, terminal TM24a, and the like.

A signal path to be selected by the selection unit SELU is determined when, for example, the semiconductor device SEM1 is tested. If, for example, the bumps BP3b and BP4a are short-circuited, the signal path including the terminal TM10a, bump BP0a, terminal TM20a, and the like is being selected as a signal path between the signal lines WL10 and WL20. The signal path including the terminal TM12a, bump BP2a, terminal TM22a, and the like is being selected as a signal path between the signal lines WL11 and WL21.

If, for example, the bumps BP2a and BP3b are short-circuited, the selection unit SELU selects the signal path including the terminal TM14a, bump BP4a, terminal TM24a, and the like as a signal path between the signal lines WL11 and WL21. Even if mutually adjacent lines, for example, the bumps BP2a and BP3b are short-circuited, the semiconductor device SEM1 recovers the signal path between the chips CHIP1 and CHIP2.

If, for example, a plurality of terminals TM are not divided into a plurality of redundant groups, for example, a single redundant group is provided, the selection unit SELU selects a signal path including the bump BP4a from three signal paths which include the bump BP2a, the bump BP3b, and the bump BP4a, respectively. In this case, the number of targets to be selected when selecting a signal path between signal lines WL is increased, so the circuit sizes of the selector and the like that are provided for each of the signal lines WL are increased. Since, for example, a plurality of terminals TM in the semiconductor device SEM1 are divided into a plurality of redundant groups, an increase in the circuit size of the selection unit SELU may be reduced. With the semiconductor device SEM1, for example, a short-circuited signal path is recovered while an increase in the circuit size of the selection unit SELU is reduced.

The output buffer units OBU (OBU1, OBU2, and OBU3) are provided for each of output terminals TM that are part of a plurality of terminals TM belonging to the redundant groups and are used to output a signal to another chip CHIP, for example, the chip CHIP2. For example, the output buffer units OBU1, OBU2, and OBU3 are respectively provided for the terminals TM10a, TM12a, and TM14a, respectively. The terminals TM10a, TM12a, and TM14a of the chip CHIP1 are output terminals TM that are used to output a signal to the chip CHIP2, which is another chip.

The structures and operations of the output buffer units OBU2 and OBU3 may be the same as or similar to the structure and operation of the output buffer unit OBU1. A control signal CTL1 that controls the output buffer units OBU1, OBU2, and OBU3 may be common to the output buffer units OBU1, OBU2, and OBU3 or may be different from each other.

The output buffer unit OBU1 is placed between the selection unit SELU1 and the output terminal TM10a. The output buffer unit OBU1 is set to one of a high-impedance state in which an output node NDO coupled to the output terminal TM10a is set to a high-impedance and an output state, which is a state other than the high-impedance state, according to the control signal CTL1. The high-impedance state is an example of an interrupt state in which a signal output from the selection unit SELU1 is interrupted. The output state is an example of a relay state in which a signal output from the selection unit SELU1 is relayed.

In the output state, the output buffer unit OBU1 outputs, from the output node NDO, a signal at a logic level corresponding to a signal received at an input node NDI. For example, the output buffer unit OBU1 receives, at the input node NDI, a signal forwarded from the selection unit SELU1. For example, the output buffer unit OBU1 receives a test signal used to test a connection between the chips CHIP1 and CHIP2 at the input node NDI through a scan chain or the like.

The output buffer unit OBU1 that has been set to the output state outputs a signal at a logic level corresponding to a signal received at the input node NDI, from the output node NDO to the terminal TM10a. The signal forwarded to the input node NDI of the output buffer unit OBU1 is forwarded to the chip CHIP2. If the output buffer unit OBU1 has been set to the high-impedance state, the signal forwarded to the input node NDI of the output buffer unit OBU1 is not transmitted to the chip CHIP2.

The pull-up units PUU (PUU1, PUU2, and PUU3) and pull-down units PDU (PDU1, PDU2, and PDU3) are provided for each of output terminals TM that are part of a plurality of terminals TM belonging to the redundant groups and are used to output a signal to another chip CHIP. The structures and operations of the pull-up units PUU2 and PUU3 may be the same as or similar to the structure and operation of the pull-up units PUU1. The structures and operations of the pull-down units PDU2 and PDU3 may be the same as or similar to the structure and operation of the pull-down units PDU1.

A control signal CTL2 that controls the pull-up units PUU1, PUU2, and PUU3 illustrated in FIG. 1A may be common to the pull-up units PUU1, PUU2, and PUU3 or may be different from each other. Similarly, a control signal CTL3 that controls the pull-down units PDU1, PDU2, and PDU3 may be common to the pull-down units PDU1, PDU2, and PDU3 or may be different from each other.

The pull-up unit PUU1 connects the output terminal TM10a and a power supply line VDD, to which the power supply voltage VDD is supplied, through a resistor or disconnects the output terminal TM10a and power supply line VDD. For example, the pull-up unit PUU1 sets the state of the output terminal TM10a to a pull-up state in which the output terminal TM10a and power supply line VDD are coupled through a resistor or to a state in which the output terminal TM10a and power supply line VDD are not coupled, in response to the control signal CTL2.

The pull-down unit PDU1 connects the output terminal TM10a and a ground line GND, to which the ground voltage GND is supplied, through a resistor or disconnects the output terminal TM10a and ground line GND. For example, the pull-down unit PDU1 sets the state of the output terminal TM10a to a pull-down state in which the output terminal TM10a and ground line GND are connected through a resistor or to a state in which the output terminal TM10a and ground line GND are disconnected, in response to the control signal CTL3.

For example, the output terminal TM10a is set to the pull-up state, the pull-down state, or another state when a short-circuit test is executed to detect mutually short-circuited lines from a plurality of lines that interconnect the chips CHIP1 and CHIP2, such as bumps BP, and the like. A short-circuit test may be executed to detect mutually short-circuited lines from a plurality of lines that interconnect the chips CHIP1 and CHIP2.

A test apparatus that tests the semiconductor device SEM1 selects the redundant group A, which is a target to be inspected, from a plurality of redundant groups. The test apparatus executes a first test (also referred to below as the first short-circuit test) in which data at a first level (also referred to below as the low logic level) corresponding to the ground voltage GND is transmitted to signal paths corresponding to redundant groups other than the redundant group under inspection, for example, the redundant group B and the like. The test apparatus executes a second test (also referred to below as the second short-circuit test) in which data at a second level (also referred to below as the high logic level) corresponding to the power supply voltage VDD is transmitted to signal paths corresponding to the redundant groups other than the redundant group under inspection.

For example, the test apparatus sets the output buffer units OBU (OBU1, OBU2, and OBU3) corresponding to the redundant group A under inspection to the high-impedance state by controlling the control signal CTL1.

In the first short-circuit test, the test apparatus sets the terminals TM (TM10a, TM12a, and TM14a) belonging to the redundant group A under inspection to the pull-up state. For example, the test apparatus interconnects the terminals TM (TM10a, TM12a, and TM14a) belonging to the redundant group A under inspection and the power supply line VDD through a resistor by controlling the control signal CTL2 for the pull-up unit PUU corresponding to the redundant group A under inspection. Therefore, a signal at the high logic level signal is transmitted to signal paths corresponding to the redundant group A under inspection.

The test apparatus forwards data at the low logic level to signal paths corresponding to the redundant groups other than the redundant group under inspection. For example, the test apparatus sets the output buffer units OBU corresponding to the redundant groups other than the redundant group under inspection to the output state by controlling the control signal CTL1. The test apparatus forwards data at the low logic level to the input node NDI of the output buffer unit OBU through a scan chain or the like. Therefore, the data at the low logic level is forwarded to signal paths corresponding to the redundant groups other than the redundant group under inspection.

In a signal path that corresponds to the redundant group A under inspection and is short-circuited to a signal line corresponding to a redundant group other than the redundant group A or to the ground line GND, data at the low logic level is transmitted. Therefore, a short-circuit is detected between a signal line corresponding to the redundant group A and a signal path corresponding to a redundant group other than the redundant group A or the ground line GND.

In the second short-circuit test, the test apparatus sets the terminals TM (TM10a, TM12a, and TM14a) belonging to the redundant group A under inspection to the pull-down state. For example, the test apparatus interconnects the terminals TM (TM10a, TM12a, and TM14a) belonging to the redundant group A under inspection and their respective ground lines GND through resistors by controlling the control signal CTL3 for the pull-down units PDU corresponding to the redundant group A under inspection. Therefore, signals at the low logic level are transmitted to the signal paths corresponding to the redundant group A under inspection.

The test apparatus forwards data at the high logic level to signal paths corresponding to the redundant groups other than the redundant group under inspection. For example, the test apparatus sets the output buffer units OBU corresponding to the redundant groups other than the redundant group under inspection to the output state by controlling the control signal CTL1. The test apparatus forwards data at the high level to the input node NDI of the output buffer unit OBU through a scan chain or the like. Therefore, the data at the high logic level is forwarded to signal paths corresponding to the redundant groups other than the redundant group under inspection.

In a signal path that corresponds to the redundant group A under inspection and is short-circuited to a signal line corresponding to a redundant group other than the redundant group A or to the power supply line VDD, data at the high logic level is transmitted. Therefore, a short-circuit is detected between a signal line corresponding to the redundant group A and a signal path corresponding to a redundant group other than the redundant group A or the power supply line VDD.

The test apparatus may execute the first short-circuit test and the second short-circuit test for each redundant group. The test apparatus identifies a signal path in which a failure such as a short circuit has occurred according to test results in the first short-circuit test and the second short-circuit test, and determines a signal path between the chips CHIP1 and CHIP2. For example, the selection units SELU1 and SELU2 each select a terminal TM to which to transmit a signal from a plurality of terminals TM according to test results in the first short-circuit test and the second short-circuit test.

As illustrated in FIG. 1B, the interval between mutually adjacent terminals TM of a plurality of terminals TM belonging to the same redundant group is larger than the interval β. Therefore, if there is no short-circuit between terminals TM that are mutually adjacent at the interval β, which are, for example, between a terminal TM belonging to the redundant group A and a terminal TM belonging to the redundant group B, the test apparatus determines that there is no short-circuit between the mutually adjacent terminals TM belonging to the redundant group A under inspection.

With the semiconductor device SEM1, therefore, mutually short-circuited signal paths are identified according to test results of the first short-circuit test and the second short-circuit test, which are executed for each redundant group. With a semiconductor device in which a plurality of terminals TM belonging to the same redundant group are adjacent at the interval β, for example, mutually short-circuited signal paths may not be identified according to test results of the first short-circuit test and the second short-circuit test, which are executed for each redundant group. In this semiconductor device, even if there is no short-circuit between a terminal TM belonging to the redundant group under inspection and a terminal TM belonging to a redundant group other than the redundant group under inspection, there may be a short-circuit between mutually adjacent terminals TM belonging to the redundant group under inspection.

With a semiconductor device in which a plurality of terminals TM belonging to the same redundant group are adjacent at the interval β, therefore, a signal path in which a failure such as a short-circuit has occurred is identified by executing tests equivalent to the first short-circuit test and the second short-circuit test for each terminal TM. Therefore, a time taken in the short-circuit tests is increased. With the semiconductor device SEM1, for example, a time taken in the short-circuit tests may be shortened.

The semiconductor device SEM1, for example, may have a test circuit that executes the first short-circuit test and the second short-circuit test. For example, if the chip CHIP2 has output terminals TM, which are part of a plurality of terminals TM belonging to a redundant group, the chip CHIP2 may have output buffer units OBU, pull-up units PUU, and pull-down units PDU.

For example, the pull-up units PUU and the pull-down units PDU may be excluded from the chip CHIP1. In this case, a test apparatus that tests the semiconductor device SEM1 sets the output buffer units OBU corresponding to the redundant group A to the high-impedance state and also sets the output buffer units OBU corresponding to redundant groups (such as the redundant group B and the like) other than the redundant group A to the output state.

The test apparatus executes the first short-circuit test in which data at the first level corresponding to the ground voltage GND is forwarded to signal paths corresponding to redundant groups other than the redundant group A. The test apparatus executes the second short-circuit test in which data at the second level corresponding to the power supply voltage VDD is forwarded to the signal paths corresponding to the redundant groups other than the redundant group A.

The test apparatus selects a terminal TM at which a signal is transmitted from a plurality of terminals TM belonging to the redundant group A by controlling the selection unit SELU1 according to results in the first short-circuit test and the second short-circuit test. A test to select a terminal TM at which a signal is transmitted from a plurality of terminals TM belonging to the redundant groups other than the redundant group A may be similar to a test to select a terminal TM to which to transmit a signal from a plurality of terminals TM belonging to the redundant group A and may be executed for each redundant group.

In FIG. 1A and FIG. 1B, a plurality of signal paths which include terminals TM and the like are divided into a plurality of redundant groups, and a plurality of terminals TM belonging to the same redundant group are placed at intervals larger than the interval β. A failed signal path is recovered for each redundant group. For example, one selection unit SELU is provided for each redundant group, and the output buffer unit OBU, the pull-up unit PUU, and the one pull-down unit PDU are provided for each output terminal TM, which is part of a plurality of terminals TM belonging to the redundant groups.

A test apparatus that tests the semiconductor device SEM1 executes the first short-circuit test and the second short-circuit test, in which data at a logic level different from the first short-circuit test is forwarded, for each redundant group while controlling the output buffer unit OBU, pull-up unit PUU, and pull-down unit PDU. When compared with a case in which the first short-circuit test and the second short-circuit test are executed for each terminal TM, a time taken in the short-circuit tests may be shortened. The manufacturing cost of the semiconductor device may be reduced.

Figure 2:
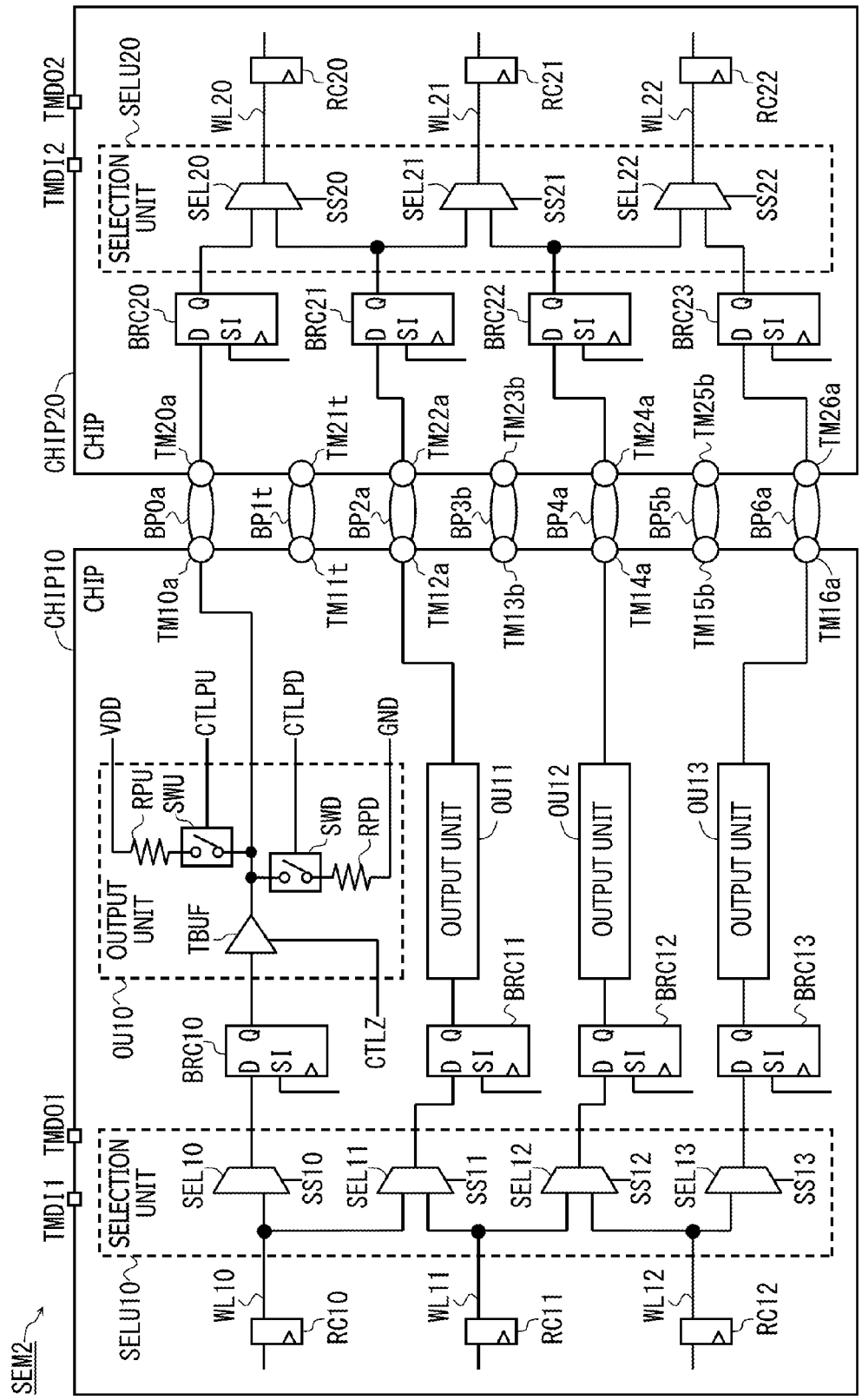
FIG. 2 illustrates an example of a semiconductor device.

FIG. 2 illustrates an example of a semiconductor device. In FIG. 2, elements that are substantially the same as or similar to elements illustrated in FIG. 1A and FIG. 1B may be assigned the same reference characters or similar reference characters and their detailed explanation may be omitted or reduced. The meanings of the suffixes a, b, and t of the terminals TM (TM10a, TM11t, TM15b, TM20a, TM21t, TM25b, and the like) and bumps BP (BP0a, BP1t, BP5b, and the like) illustrated in FIG. 2 are the same as or similar to the meanings of the suffixes in FIG. 1A.

The semiconductor device SEM2 may be a SiP in which a plurality of chips CHIP (CHIP10 and CHIP20) are included in a single package. For example, the semiconductor device SEM2 has a plurality of chips CHIP (CHIP10 and CHIP20) and bumps BP that mutually couple a plurality of terminals TM placed on certain planes of the plurality of chips CHIP. A certain number of terminals TM on each of the plurality of chips CHIP may belong to any one of a plurality of redundant groups.

The chip CHIP10 has flip-flop circuits RC (RC10 to RC12), a selection unit SELU10, flip-flop circuits BRC (BRC10 to BRC13), output units OU (OU10 to OU13), and terminals TM. Of the terminals TM, a terminal TMDO1 is a test output terminal from which data is output to the outside of the chip CHIP10. Of the terminals TM, a terminal TMDI1 is a test input terminal at which data is received from the outside of the chip CHIP10. The test output terminal TMDO1 and test input terminal TMDI1 of the chip CHIP10 may be placed as external terminals of the semiconductor device SEM2 or may be coupled to certain terminals TM of another chip CHIP (chip CHIP20, for example) through bumps BP.

To make FIG. 2 easy to view, the selection unit SELU10, output units OU, and flip-flop circuits BRC that correspond to redundant groups other than the redundant group A for example, the redundant group B may not be illustrated. In FIG. 2, signal lines coupled to the test output terminal TMDO1 and test input terminal TMDI1, signal lines from which clocks are supplied to the flip-flop circuits RC and BRC, and the like may not be illustrated.

The flip-flop circuits RC (RC10, RC11, and RC12) may be part of logic circuits that implement the functions of the chip CHIP10. For example, the flip-flop circuits RC10, RC11, and RC12 may be part of internal circuits of the chip CHIP10. For example, the outputs of the flip-flop circuits RC10, RC11, and RC12 are coupled to the selection unit SELU10 respectively through the signal lines WL10, WL11, and WL12.

The selection unit SELU10 is provided for each of a plurality of redundant groups. From a plurality of terminals TM, the selection unit SELU10 selects a terminal TM at which a signal is transmitted. From the four terminals TM10a, TM12a, TM14a, and TM16a, the selection unit SELU10 selects three terminals TM that are to be electrically coupled to the three signal lines WL10, WL11, and WL12, respectively, in the chip CHIP10. For example, from the four bumps BP, the selection unit SELU10 selects three bumps BP to be used in signal paths between the three signal lines WL in the chip CHIP10 and the three signal lines WL in the chip CHIP20.

For example, the selection unit SELU10 has selectors SEL (SEL10, SEL11, SEL12, and SEL13) corresponding to output terminals TM of a plurality of terminals TM belonging to corresponding redundant groups. For example, the selectors SEL10, SEL11, SEL12, and SEL13 are provided respectively for the terminals TM10a, TM12a, TM14a, and TM16a. The terminals TM10a, TM12a, TM14a, and TM16a of the chip CHIP10 are output terminals TM from which signals are output to the chip CHIP20, which is another chip.

One of the two input terminals of the selector SEL10 is coupled to the output of the flip-flop circuit RC10 through the signal line WL10. The other of the two input terminals is open. If, for example, a selection signal SS10 indicates selection of the one of the two input terminals, the selector SEL10 forwards a signal received through the signal line WL10 to the data input terminal D of the flip-flop circuit BRC10. If the selection signal SS10 indicates selection of the other of the two input terminals, the selector SEL10 does not output a signal received through the signal line WL10. In this way, the selector SEL10 forwards a signal received through the signal line WL10 to the data input terminal D of the flip-flop circuit BRC10, according to the selection signal SS10. The selector SEL10 may be a switch that makes a switchover between a conducted state and a non-conducted state.

The two input terminals of the selector SEL11 are coupled to the outputs of the flip-flop circuits RC10 and RC11 respectively through the signal lines WL10 and WL11. For example, the selector SEL11 forwards one of a signal received through the signal line WL10 and a signal received through the signal line WL11 to the data input terminal D of the flip-flop circuit BRC11, according to a signal line SS11.

The two input terminals of the selector SEL12 are coupled to the outputs of the flip-flop circuits RC11 and RC12 respectively through the signal lines WL11 and WL12. For example, the selector SEL12 forwards one of a signal received through the signal line WL11 and a signal received through the signal line WL12 to the data input terminal D of the flip-flop circuit BRC12, according to a signal line SS12.

One of the two input terminals of the selector SEL13 is coupled to the output of the flip-flop circuit RC12 through the signal line WL12. The other of the two input terminals is open. If, for example, a selection signal SS13 indicates selection of the one of the two input terminals, the selector SEL13 forwards a signal received through the signal line WL12 to the data input terminal D of the flip-flop circuit BRC13. If the selection signal SS13 indicates selection of the other of the two input terminals, the selector SEL13 does not output a signal received through the signal line WL12. In this way, the selector SEL 13 forwards a signal received through the signal line WL12 to the data input terminal D of the flip-flop circuit BRC13, according to the selection signal SS13. The selector SEL13 may be a switch that makes a switchover between the conducted state and the non-conducted state.

The flip-flop circuits BRC (BRC10, BRC11, BRC12, and BRC13) each may be an example of a holding unit disposed between the selection unit SELU10 and a buffer TBUF in an output unit OU (OU10, OU11, OU12, or OU13). The flip-flop circuit BRC (BRC10, BRC11, BRC12, or BRC13) is provided for each output terminal TM, which is part of a plurality of terminals TM belonging to the redundant groups, from which a signal is output to another chip CHIP (chip CHIP20, for example). For example, the flip-flop circuits BRC10, BRC11, BRC12, and BRC13 are provided respectively for the terminals TM10a, TM12a, TM14a, and TM16a.

The flip-flop circuit BRC may be a flip-flop circuit corresponding to a scan test. A flip-flop circuit corresponding to a scan test may be referred to below as a scan flip-flop circuit.

For example, in a scan mode, the flip-flop circuits BRC are included in a scan chain. Each of a plurality of flip-flop circuits BRC included in a scan chain receives, at a scan input terminal SI, data output from the data output terminal Q of the preceding flip-flop circuit BRC. Each of the plurality of flip-flop circuits BRC holds the data received at the scan input terminal SI in synchronization with a clock. Each of the plurality of flip-flop circuits BRC outputs the held data from the data output terminal Q in synchronization with a clock.

Figure 6:
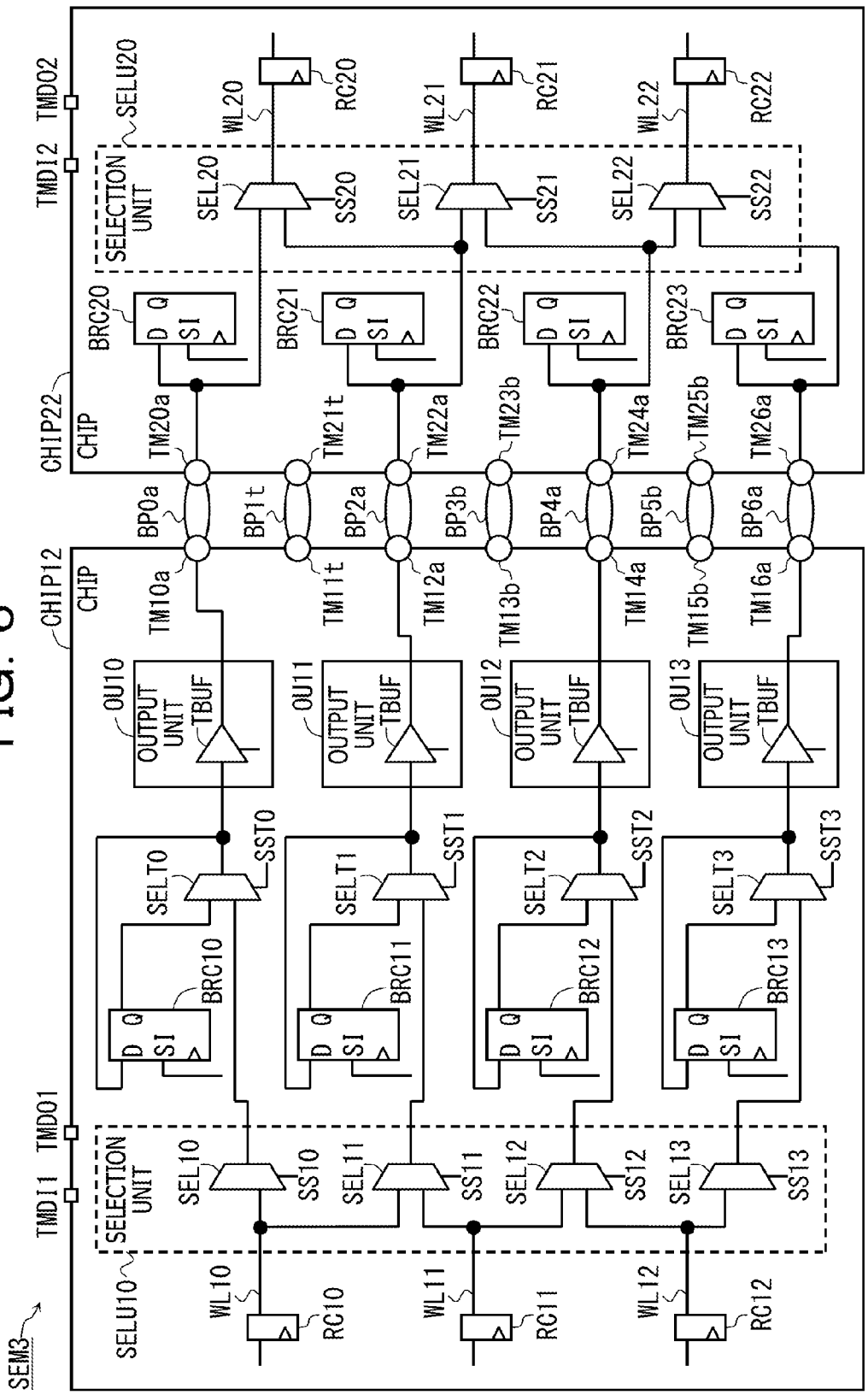
FIG. 6 illustrates an example of a semiconductor device.
Figure 7:
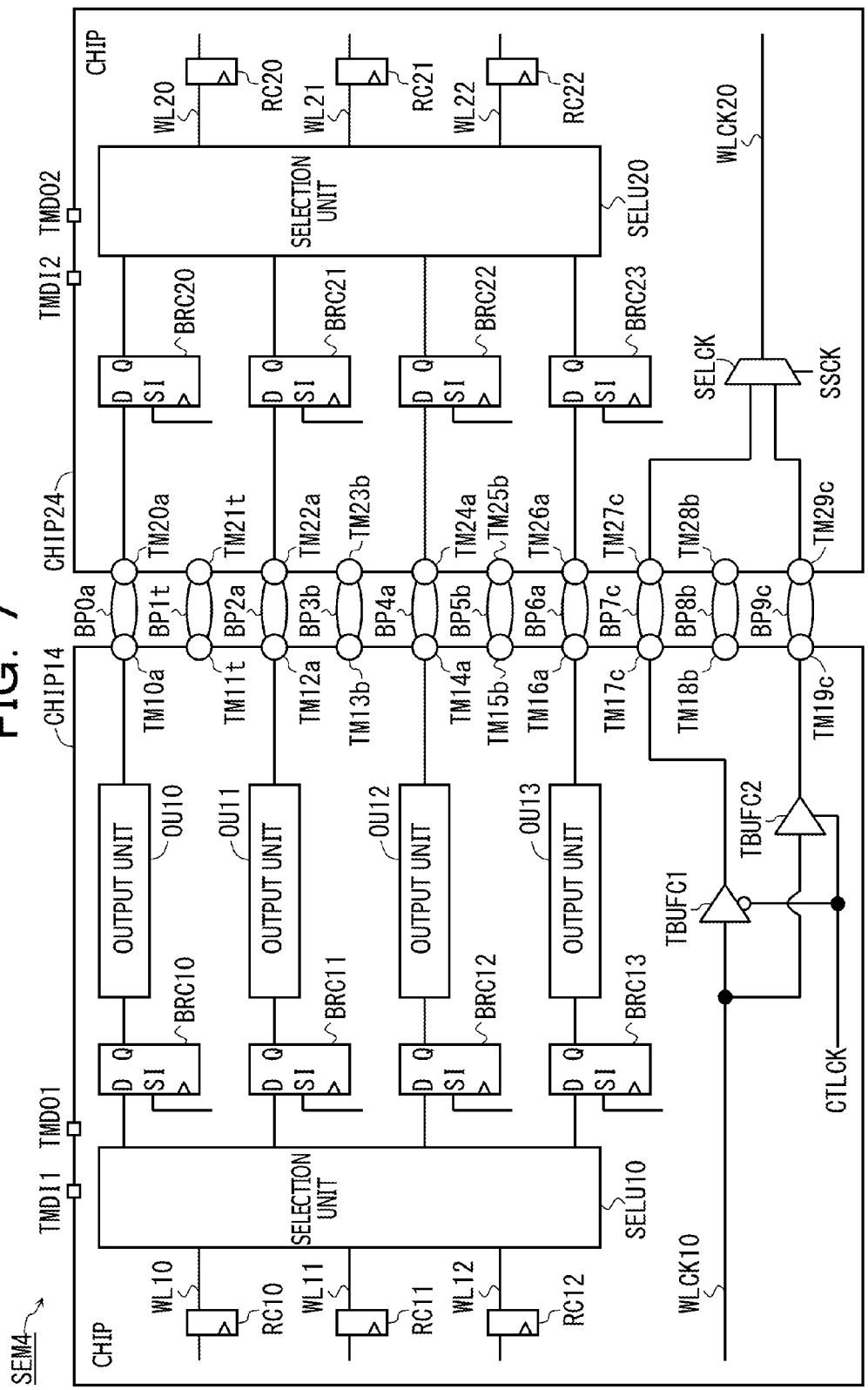
FIG. 7 illustrates an example of a semiconductor device.

For example, in a non-scan mode, the plurality of flip-flop circuits BRC hold data received at the data input terminals D in synchronization with a clock. Each of the plurality of flip-flop circuit BRC outputs the held data from the data output terminal Q in synchronization with a clock. In FIGS. 2, 6, and 7, a signal that switches the flip-flop circuit BRC between the scan mode and the non-scan mode, a scan chain, and the like may be omitted to avoid these drawings from becoming complex. For example, the data output terminal Q of the flip-flop circuit BRC is coupled to the scan input terminal SI of the succeeding flip-flop circuit BRC in the scan chain.

In a test for, for example, the selector SEL10 in the selection unit SELU10, the flip-flop circuit BRC10 forwards, to the test output terminal TMDO1, data received at the data input terminal D from the test input terminal TMDI1 through the selector SEL10. For example, while the scan mode is in progress, a scan flip-flop circuit holds data to be forwarded from the test input terminal TMDI1 through a scan chain or the like. After having been set to the non-scan mode, the flip-flop circuit forwards the held data to the selector SEL10.

The flip-flop circuit BRC10, which has been set to the non-scan mode, receives the data forwarded from the test input terminal TMDI1 at the data input terminal D through the selector SEL10. The flip-flop circuit BRC10 holds the data received at the data input terminal D. After that, the flip-flop circuit BRC10 is set to the scan mode. Thus, the data held in the flip-flop circuit BRC10 is forwarded from the data output terminal Q of the flip-flop circuit BRC10 through a scan chain or the like to the test output terminal TMDO1.

Whether the selector SEL10 in the selection unit SELU10 is normal is determined by comparing the data forwarded to the test output terminal TMDO1 with an expected value. Before the chip CHIP10 and chip CHIP20 are interconnected, each selector SEL in the selection unit SELU10 is tested with the chip CHIP10 being standalone.

In a test for a connection between the chips CHIP10 and CHIP20, the flip-flop circuit BRC10 outputs the data received at the scan input terminal SI to the buffer TBUF in the output unit OU10. For example, while the scan mode is in progress, the flip-flop circuit BRC10 holds data to be forwarded through a scan chain or the like. After having been set to the non-scan mode, the flip-flop circuit BRC10 forwards the held data to the buffer TBUF in the output unit OU10.

If the chip CHIP10 is in a normal mode, the flip-flop circuit BRC10 is set to the non-scan mode. While the normal mode is in progress, therefore, the flip-flop circuit BRC10 outputs, to the buffer TBUF in the output unit OU10, the data that has been received at the data input terminal D from the flip-flop circuit RC10 through the selector SEL10.

For example, while the normal mode is in progress, the flip-flop circuit BRC10 may be used as part of logic circuits that implement the functions of the chip CHIP10. The structures and operations of the flip-flop circuits BRC11, BRC12, and BRC13 may be substantially the same as or similar to the structure and operation of the flip-flop circuit BRC10.

The output units OU (OU10, OU11, OU12, and OU13) are provided for terminals TM that are part of a plurality of terminals TM belonging to the redundant groups and are used to output a signal to another chip CHIP, for example, the chip CHIP20. For example, the output buffer units OU10, OU11, OU12, and OU13 are provided respectively for the terminals TM10a, TM12a, TM14a, and TM16a. The structures and operations of the output units OU11, OU12, and OU13 may be substantially the same as or similar to the structure and operation of the output unit OU10. In FIG. 2, the structure of the output unit OU10 is illustrated. Control signals CTLZ, CTLPU, and CTLPD that control the output units OU10, OU11, OU12, and OU13 may be common to the output units OU10, OU11, OU12, and OU13 or may be different from each other.

The output unit OU10 is placed between the flip-flop circuit BRC10 and the output terminal TM10a. For example, the output unit OU10 has a buffer TBUF, a pull-up resistor RPU, a pull-up switch SWU, a pull-down resistor RPD, and a pull-down switch SWD.

The buffer TBUF may be an example of an output buffer unit that is set to one of the output state and the high-impedance state. The buffer TBUF may be a three-state buffer that makes a switchover to output a signal according to an input signal or to set its output to a high-impedance. The output terminal of the buffer TBUF is coupled to the output terminal TM10a.

If, for example, the control signal CTLZ indicates that a signal according to an input signal is to be output, the buffer TBUF outputs data received from the data output terminal Q of the flip-flop circuit BRC10 to the terminal TM10a. If the control signal CTLZ indicates that an output is to be set to a high-impedance output, the buffer TBUF sets the output terminal of the buffer TBUF to a high-impedance. In this case, data output from the data output terminal Q of the flip-flop circuit BRC10 is not forwarded to the output terminal TM10a.

A circuit including the pull-up resistor RPU, which is coupled to the power supply line VDD and the switch SWU, may be an example of a pull-up unit. One end of the pull-up resistor RPU is coupled to the power supply line VDD, and the other end of the pull-up resistor RPU is coupled to one end of the input terminals of the switch SWU. The other end of the input terminals of the switch SWU is coupled to the output terminal TM10a. The switch SWU is switched between the conducted state and the non-conducted state according to the control signal CTLPU received at a control terminal. The switch SWU may be, for example, a switch that uses a metal-oxide semiconductor (MOS) transistor. If, for example, the control signal CTLPU is at the low logic level, the switch SWU is set to the conducted state. If the control signal CTLPU is at the high logic level, the switch SWU is set to the non-conducted state.

If, for example, the control signal CTLPU is at the low logic level, the switch SWU is in the conducted state, so the output terminal TM10a and power supply line VDD are coupled through the pull-up resistor RPU. Therefore, the output terminal TM10a is set to the high logic level. If the control signal CTLPU is at the high logic level, the switch SWU is in the non-conducted state, so the output terminal TM10a and power supply line VDD are not coupled.

A circuit including the pull-down resistor RPD, which is coupled to the ground line GND, and the switch SWD may be an example of a pull-down unit. One end of the pull-down resistor RPD is coupled to the ground line GND, and the other end of the pull-down resistor RPD is coupled to one end of the input terminals of the switch SWD. The other end of the input terminals of the switch SWD is coupled to the output terminal TM10a. The switch SWD is switched between the conducted state and the non-conducted state according to the control signal CTLPD received at a control terminal. The switch SWD may be, for example, a switch that uses a MOS transistor. If, for example, the control signal CTLPD is at the high logic level, the switch SWD is set to the conducted state. If control signal CTLPD is at the low logic level, the switch SWD is set to the non-conducted state.

If, for example, the control signal CTLPD is at the high logic level, the switch SWD is in the conducted state, so the output terminal TM10a and ground line GND are coupled through the pull-down resistor RPD. Therefore, the output terminal TM10a is set to the low logic level. If the control signal CTLPD is at the low logic level, the switch SWD is in the non-conducted state, so the output terminal TM10a and ground line GND are not coupled.

The chip CHIP20 has flip-flop circuits RC (RC20 to RC22), flip-flop circuits BRC (BRC20 to BRC23), a selection unit SELU20, and terminals TM. Of the terminals TM, a terminal TMDO2 is a test output terminal from which data is output to the outside of the chip CHIP20. Of the terminals TM, a terminal TMDI2 is a test input terminal at which data is received from the outside of the chip CHIP20. The test output terminal TMDO2 and the test input terminal TMDI2 of the chip CHIP20 may be placed as external terminals of the semiconductor device SEM2 or may be coupled to certain terminals TM of another chip CHIP, for example, the chip CHIP10, through bumps BP.

To make FIG. 2 easy to view, the selection unit SELU20, flip-flop circuits BRC, and the like corresponding to redundant groups other than the redundant group A, for example, the redundant group B, may not be illustrated. In FIG. 2, signal lines coupled to the test output terminal TMDO2 and the test input terminal TMDI2, signal lines from which clocks are supplied to the flip-flop circuits RC and BRC, and the like may not be illustrated.

The flip-flop circuits RC (RC20, RC21, and RC22) may be part of logic circuits that implement the functions of the chip CHIP20. For example, the flip-flop circuits RC20, RC21, and RC22 may be part of internal circuits of the chip CHIP20. For example, the inputs of the flip-flop circuits RC20, RC21, and RC22 are coupled to the selection unit SELU20 respectively through the signal line WL20, WL21, and WL22.

The flip-flop circuits BRC (BRC20, BRC21, BRC22, and BRC23) are flip-flop circuits corresponding to a scan test. Each of the flip-flop circuits BRC (BRC20, BRC21, BRC22, or BRC23) is provided for each output terminal TM, which is part of a plurality of terminals TM belonging to the redundant groups, and at which a signal is received from another chip CHIP, for example, the chip CHIP10.

For example, the flip-flop circuits BRC20, BRC21, BRC22, and BRC23 are provided respectively for the terminals TM20a, TM22a, TM24a, and TM26a. The terminals TM20a, TM22a, TM24a, and TM26a of the chip CHIP20 are input terminals TM that receive a signal from the chip CHIP10, which is another chip.

The data input terminal D of the flip-flop circuit BRC20 is coupled to the terminal TM20a, and the data output terminal Q of the flip-flop circuit BRC20 is coupled to the selector SEL20 in the selection unit SELU20. In a test for a connection between the chips CHIP10 and CHIP20, the flip-flop circuit BRC20 is first set to the non-scan mode. Therefore, the flip-flop circuit BRC20 receives data that has been forwarded to the terminal TM10a of the chip CHIP10 at the data input terminal D through the bump BP0a and terminal TM20a.

The flip-flop circuit BRC 20 holds the data received at the data input terminal D, for example, data forwarded from the chip CHIP10, in synchronization with a clock. Then, the flip-flop circuit BRC20 is set to the scan mode. Therefore, the data held in the flip-flop circuit BRC20 is output from the data output terminal Q of the flip-flop circuit BRC20 to the outside of the semiconductor device SEM2 through a scan chain or the like.

If the chip CHIP20 is in the normal mode, the flip-flop circuit BRC20 is set to the non-scan mode. While the normal mode is in progress, therefore, the flip-flop circuit BRC20 outputs, to the selector SEL20, the data received at the data input terminal D from the terminal TM10a of the chip CHIP10 through the bump BP0a and terminal TM20a. For example, while the normal mode is in progress, the flip-flop circuit BRC20 may be used as part of logic circuits that implement the functions of the chip CHIP20. The structures and operations of the flip-flop circuits BRC21, BRC22, and BRC23 may be substantially the same as or similar to the structure and operation of the flip-flop circuit BRC20.

For example, the data input terminal D of the flip-flop circuit BRC21 is coupled to the terminal TM22a, and the data output terminal Q of the flip-flop circuit BRC21 is coupled to the selector SEL20 and SEL21 of the selection unit SELU20. The data input terminal D of the flip-flop circuit BRC22 is coupled to the terminal TM24a, and the data output terminal Q of the flip-flop circuit BRC22 is coupled to the selector SEL21 and SEL22 of the selection unit SELU20. The data input terminal D of the flip-flop circuit BRC23 is coupled to the terminal TM26a, and the data output terminal Q of the flip-flop circuit BRC23 is coupled to the selector SEL22 of the selection unit SELU20.

The selection unit SELU20 is provided for each of a plurality of redundant groups. From a plurality of terminals TM, the selection unit SELU20 selects a terminal TM at which a signal is transmitted. From the four terminals TM20a, TM22a, TM24a, and TM26a, the selection unit SELU20 selects three terminals TM that are to be electrically coupled to the three signal lines WL20, WL21, and WL22, respectively, in the chip CHIP20. For example, from the four bumps BP, the selection unit SELU20 selects three bumps BP to be used in signal paths between the three signal lines WL in the chip CHIP10 and the three signal lines WL in the chip CHIP20.

For example, the selection unit SELU20 has selectors SEL (SEL20, SEL21, and SEL22) corresponding to the signal lines WL, each of which is coupled to one of a plurality of terminals TM belonging to corresponding redundant groups.

The two input terminals of the selector SEL20 are coupled to the data output terminals Q of the flip-flop circuits BRC20 and BRC21, respectively. For example, the selector SEL20 forwards one of a signal received from the flip-flop circuit BRC20 and a signal received from the flip-flop circuit BRC21 to the flip-flop circuit RC20 through the signal line WL20, according to a selection signal SS20.

The two input terminals of the selector SEL21 are coupled to the data output terminals Q of the flip-flop circuits BRC21 and BRC22, respectively. For example, the selector SEL21 forwards one of a signal received from the flip-flop circuit BRC21 and a signal received from the flip-flop circuit BRC22 to the flip-flop circuit RC21 through the signal line WL21, according to a selection signal SS21.

The two input terminals of the selector SEL22 are coupled to the data output terminals Q of the flip-flop circuits BRC22 and BRC23, respectively. For example, the selector SEL22 forwards one of a signal received from the flip-flop circuit BRC22 and a signal received from the flip-flop circuit BRC23 to the flip-flop circuit RC22 through the signal line WL22, according to a selection signal SS22.

In this way, the selection units SELU10 and SELU20 select a signal path between the chip CHIP10 and CHIP20. If, for example, the bumps BP3b and BP4a are short-circuited, the selection units SELU10 and SELU20 select the signal path including the terminal TM10a, bump BP0a, terminal TM20a, and the like as the signal path between the signal lines WL10 and WL20. The selection units SELU10 and SELU20 select the signal path including the terminal TM12a, bump BP2a, terminal TM22a, and the like as the signal path between the signal lines WL11 and WL21. The selection units SELU10 and SELU20 select the signal path including the terminal TM16a, bump BP6a, terminal TM26a, and the like as the signal path between the signal lines WL12 and WL22.

If, for example, the bumps BP2a and BP3b are short-circuited, the selection units SELU10 and SELU20 select the signal path including the terminal TM14a, bump BP4a, terminal TM24a, and the like as the signal path between the signal lines WL11 and WL21. As described above, with the semiconductor device SEM2, even if mutually adjacent lines, for example, the bumps BP2a and BP3b are short-circuited, the signal path between the chips CHIP10 and CHIP20 is recovered.

If, for example, a plurality of terminals TM have not been divided into a plurality of redundant groups, for example, if there is only one redundant group, each selector SEL has three input terminals and selects one signal path from three signal paths. If the number of redundant lines is denoted k, each selector SEL selects one input from (k+1) inputs. When one input is selected from (k+1) inputs, the number of selection signals SS to each selector SEL is increased, so the circuit size of the selection unit SELU including circuits that create selection signals SS may be increased.

As for selectors SEL that include three-state buffers, a selector SEL that selects one input from (k+1) inputs has (k+1) three-state buffers. If the number of signal lines is denoted n, therefore, the circuit size of the selection unit SELU in each chip CHIP is equivalent to the circuit size of n×(k+1) three-state buffers. Thus, as the number k of redundant lines increases, the circuit size of the selection unit SELU may increase.

If, for example, the number of microbumps is 1000 and the number of redundant lines is 10, the circuit size of the selection unit SELU is equivalent to the circuit size of about 10,000 three-state buffers. If, for example, 1000 bumps BP in the semiconductor device SEM2 are divided into 10 redundant groups, the number n of signal line in each redundant group is 99 and the number k of redundant lines is 1. In this case, the circuit size of the selection unit SELU corresponding to one redundant group is equivalent to the circuit size of about 200 three-state buffers. Since the number of redundant groups is 10, the circuit size of the selection unit SELU in each chip CHIP is equivalent to the circuit size of about 2000 three-state buffers, which is about one-fifth when compared with a case in which a plurality of terminals TM have not been divided into a plurality of redundant groups.

Thus, since a plurality of terminals TM in the semiconductor device SEM2 have been divided into a plurality of redundant groups, an increase in the circuit size of the selection unit SELU is reduced. As for the semiconductor device SEM2, for example, a short-circuited signal path may be recovered while an increase in the circuit size of the selection unit SELU is reduced.

As with the chip CHIP10, each selector SEL in the selection unit SELU is tested with the chip CHIP20 being standalone. For example, while the scan mode is in progress, the flip-flop circuit BRC20 and the like hold data to be forwarded from the test input terminal TMDI2 through a scan chain or the like. After having been set to the non-scan mode, the flip-flop circuit BRC20 forwards the held data to the selector SEL20.

For example, the scan flip-flop holds data received at the data input terminal from the test input terminal TMDI2 through the selector SEL20 in a period during which the scan flip-flop is set to the non-scan mode. While the scan mode is in progress, the data that has been received from the test input terminal TMDI2 through the selector SEL20 and held in the scan flip-flop is forwarded to the test output terminal TMDO2 through a scan chain or the like.

Whether the selector SEL20 in the selection unit SELU20 is normal is determined by comparing the data forwarded to the test output terminal TMDO2 with an expected value. Before the chip CHIP10 and chip CHIP20 are coupled, each selector SEL in the selection unit SELU20 is tested with the chip CHIP20 being standalone.

For example, if the chip CHIP20 has output terminals TM, which are part of a plurality of terminals TM belonging to the redundant groups, the chip CHIP20 may have output units OU and the like. In a test for each selector SEL in the selection unit SELU20, for example, a scan flip-flop other than the flip-flop circuits BRC20 to BRC23 may forward data from the test input terminal TMDI2 through a scan chain or the like to the selection unit SELU20. The flip-flop circuits RC and the like may be replaced with scan flip-flops. The semiconductor device SEM2 may have test circuits that execute tests illustrated in, for example, FIGS. 4 and 5.

If the control signal CTLPU is at the low logic level, the switch SWU may be set to the non-conducted state. If the control signal CTLPU is at the high logic level, the switch SWU may be set to the conducted state. If the control signal CTLPD is at the low logic level, the switch SWD may be set to the conducted state. If the control signal CTLPD is at the high logic level, the switch SWD may be set to the non-conducted state.

FIG. 3 illustrates an example of a terminal layout. In FIG. 3, the terminal layout of the chip CHIP10 in FIG. 2 is illustrated. In FIG. 3, the front surface of the chip CHIP10 is indicated. The reference characters A and B in FIG. 3 respectively indicate the redundant groups A and B. In FIG. 3, the number of redundant groups may be, for example, 2. The number of redundant groups may be 3 or more. The reference characters VD indicate a group to which a terminal TM (power supply terminal) coupled to the power supply line VDD belongs; the group is one of the groups other than the redundant groups. The reference characters VG indicate a group to which a terminal TM (ground terminal) connected to the ground line GND belongs; the group is one of the groups other than the redundant groups.

Terminals TM are placed in a staggered form so that their intervals in horizontal directions and oblique directions become the interval β. For example, terminals TM are placed on the front surface of the chip CHIP10 so that an interval between mutually adjacent terminals TM becomes the interval β and more. For example, each of the six terminals TM adjacent to a terminal TM in the redundant group A belongs to the redundant group B, group VD, and group VG, respectively. In the terminal layout in FIG. 3, the interval β corresponds to an interval between a first terminal TM of a plurality of terminals TM in the redundant group A and a terminal TM in another redundant group (redundant group B other than the redundant group A), which is adjacent to the first terminal TM.

Terminals TM belonging to the same redundant group of a plurality of redundant groups are placed at an interval larger than the interval β. For example, an interval between terminals TM that are mutually adjacent in the redundant group A is represented by $(\sqrt{3})\times\beta$, which is larger than the predetermined interval β. As described above, a plurality of terminals TM in the redundant group A are placed at an interval larger than the interval β. Similarly, a plurality of terminals TM in the redundant group B are placed at an interval larger than the interval β. An interval between a terminal TM in the group VD and a terminal TM in the group VG is larger than the interval β.

With the semiconductor device SEM2, the probability that two terminals TM belonging to the same redundant group are short-circuited may become smaller than when an interval between mutually adjacent terminals TM belonging to the same redundant group is the interval β.

If, for example, the chip CHIP10 and chip CHIP20 are coupled so that their front surfaces face each other (flip chip connection), the layout of the terminals TM on the chip CHIP20 may be the same as or similar to the layout obtained by inverting the terminal layout of the CHIP10 to left and right. If, for example, the terminals TM on the chip CHIP10 and the terminals TM on the chip CHIP20 are coupled by using through electrodes that pass through the substrate of the chip CHIP, the layout of the terminals TM on the chip CHIP20 may be the same as or similar to the layout of the terminals TM on the chip CHIP10. The terminals TM on the chip CHIP10 may be placed in a grid form as illustrated in FIG. 1B.

Figure 4:
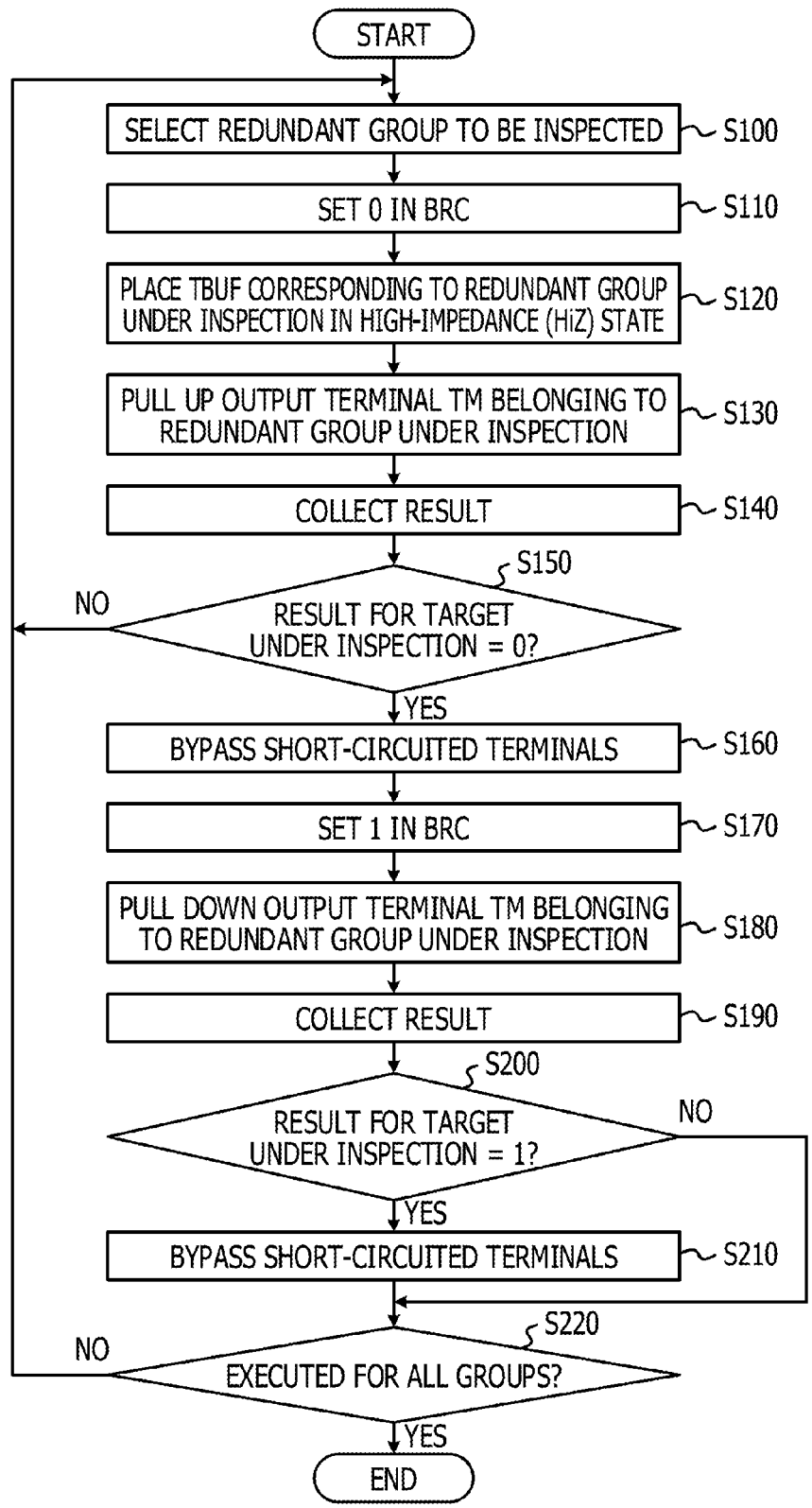
FIG. 4 illustrates an example of a short-circuit test for inter-chip signal paths.

FIG. 4 illustrates an example of a short-circuit test for inter-chip signal paths. In FIG. 4, a short-circuit test for signal paths between chips CHIP in the semiconductor device SEM2 in FIG. 2 is illustrated. For example, FIG. 4 illustrates a form of a semiconductor device test method. The short-circuit test is, for example, a test to detect mutually short-circuited lines from a plurality of lines that interconnect the chips CHIP10 and CHIP20, for example, bumps BP. The short-circuit test is executed by a test apparatus that tests the semiconductor device SEM2. HiZ in FIG. 4 indicates high impedance.

In operation S100, the test apparatus that tests the semiconductor device SEM2 selects a redundant group to be inspected from a plurality of redundant groups.

In operation S110, the test apparatus sets data of a logical value of 0 in all flip-flop circuits BRC (BRC10 to BRC13, BRC20 to BRC23, and the like). For example, after having reset all flip-flop circuits BRC, the test apparatus forwards a signal at the low logic level, for example, a logical value of 0, to the scan input terminal SI of each flip-flop circuit BRC through a scan chain or the like. Each flip-flop circuit BRC holds the signal at the low logic level.

In operation S120, the test apparatus places, in a high-impedance (HiZ) state, the buffer TBUF corresponding to the redundant group under inspection, which has been selected in operation S100. The signal at the low logic level, for example, data of a logical value of 0 set in operation S110, the signal being held in the flip-flop circuit BRC, is not forwarded to terminals TM belonging to the redundant group under inspection.

In operation S130, the test apparatus pulls up the output terminal TM belonging to the redundant group under inspection, which has been selected in operation S100. For example, the test apparatus respectively sets the switch SWU and switch SWD in the output unit OU corresponding to the redundant group under inspection, which has been selected in operation S100, to the conducted state and non-conducted state.

Therefore, the terminals TM belonging to the redundant group under inspection are set to the high logic level. The signal at the low logic level, for example, data of a logical value of 0 set in operation S110 which is held in the flip-flop circuit BRC, is forwarded to terminals TM belonging to the redundant groups other than the redundant group under inspection.

For example, a signal at the high logic level is forwarded to the data input terminal D of the flip-flop circuit BRC corresponding to each input terminal TM belonging to the redundant group under inspection, for example, an input terminal TM coupled to an output terminal TM through a bump BP. A signal at the low logic level is forwarded to the data input terminal D of the flip-flop circuit BRC corresponding to each input terminal TM belonging to the redundant groups other than the redundant group under inspection. In this way, the first short-circuit test to forward data at the low logic level to signal paths corresponding to the redundant groups other than the redundant group under inspection is executed in operations S110 to S130.

In operation S140, the test apparatus collects a result in the first short-circuit test. For example, the test apparatus obtains data stored in each flip-flop circuit BRC through a scan chain or the like.

In operation S150, the test apparatus decides whether data forwarded from each flip-flop circuit BRC corresponding to the redundant group under inspection, for example, a result in the first short-circuit test for the redundant group under inspection, includes a logical value of 0. For example, among signal paths corresponding to the redundant group under inspection, in a signal path which is short-circuited to a signal path corresponding to a redundant group other than the redundant group under inspection or a signal path which is short-circuited to the ground line GND, data with the low logic level is forwarded. Therefore, data of a logical value of 0 is held in the flip-flop circuit BRC corresponding to the signal path short-circuited to the signal path corresponding to the redundant group other than the redundant group under inspection or corresponding to the signal path short-circuited to the ground line GND.

If a result in the first short-circuit test for the redundant group under inspection includes a logical value of 0 (the result in operation S150 is Yes), the processing by the test apparatus proceeds to operation S160. If the result in the first short-circuit test for the redundant group under inspection does not include a logical value of 0 (the result in operation S150 is No), the processing by the test apparatus proceeds to operation S170.

In operation S160, the test apparatus bypasses the signal path (terminals TM and bumps BP) corresponding to the flip-flop circuit BRC that has held the data of a logical value of 0. For example, the test apparatus selects a terminal TM at a signal is transmitted from a plurality of terminals TM, according to the result in the first short-circuit test.

In operation S170, the test apparatus sets data of a logical value of 1 in all flip-flop circuits BRC (BRC10 to BRC13, BRC20 to BRC23, and the like). For example, after having reset all flip-flop circuits BRC, the test apparatus forwards a signal at the high logic level (a logical value of 1) to the scan input terminal SI of each flip-flop circuit BRC through a scan chain or the like. Each flip-flop circuit BRC holds the signal at the high logic level.

In operation S180, the test apparatus pulls down the output terminal TM belonging to the redundant group under inspection, which has been selected in operation S100. For example, the test apparatus respectively sets the switch SWU and switch SWD in the output unit OU corresponding to the redundant group under inspection, which has been selected in operation S100, to the non-conducted state and conducted state.

The terminals TM belonging to the redundant group under inspection are set to the low logic level. The signal at the high logic level held in the flip-flop circuit BRC, for example, data of a logical value of 1 set in operation S170 is forwarded to terminals TM belonging to the redundant groups other than the redundant group under inspection.

For example, a signal at the low logic level is forwarded to the data input terminal D of the flip-flop circuit BRC corresponding to each input terminal TM belonging to the redundant group under inspection for example, an input terminal TM coupled to an output terminal TM through a bump BP. A signal at the high logic level is forwarded to the data input terminal D of the flip-flop circuit BRC corresponding to each input terminal TM belonging to the redundant groups other than the redundant group under inspection. The second short-circuit test to forward data at the high logic level to signal paths corresponding to the redundant groups other than the redundant group under inspection is executed in operations S170 and S180.

In operation S190, the test apparatus collects a result in the second short-circuit test. For example, the test apparatus obtains data stored in each flip-flop circuit BRC through a scan chain or the like.

In operation S200, the test apparatus decides whether data forwarded from the flip-flop circuit BRC corresponding to the redundant group under inspection, for example, a result in the second short-circuit test for the redundant group under inspection includes a logical value of 1. For example, among signal paths corresponding to the redundant group under inspection, in a signal path which is short-circuited to a signal path corresponding to a redundant group other than the redundant group under inspection or a signal path which is short-circuited to the power supply line VDD, data with the high logic level is forwarded. Therefore, data of a logical value of 1 is held in the flip-flop circuit BRC corresponding to the signal path short-circuited to the signal path corresponding to the redundant group other than the redundant group under inspection or corresponding to the signal path short-circuited to the power supply line VDD.

If a result in the second short-circuit test for the redundant group under inspection includes a logical value of 1 (the result in operation S200 is Yes), the processing by the test apparatus proceeds to operation S210. If the result in the second short-circuit test for the redundant group under inspection does not include a logical value of 1 (the result in operation S200 is No), the processing by the test apparatus proceeds to operation S220.

In operation S210, the test apparatus bypasses the signal path (terminals TM and bumps BP) corresponding to the flip-flop circuit BRC that has held the data of a logical value of 1. For example, the test apparatus selects a terminal TM at which a signal is transmitted from a plurality of terminals TM, according to the result in the second short-circuit test.

In operation S220, the test apparatus decides whether short-circuit tests, for example, the first short-circuit test and the second short-circuit test have been executed for all redundant groups. If there is a redundant group for which the short-circuit tests have not been executed (the result in operation S220 is No), the processing by the test apparatus returns to operation S100. If the short-circuit tests have been executed for all redundant groups (the result in operation S220 is Yes), the test apparatus terminates the short-circuit tests for the signal paths between the chips CHIP in the semiconductor device SEM2.

The test apparatus executes the first short-circuit test and the second short-circuit test for each redundant group. The test apparatus identifies a signal path in which a short circuit or another failure has occurred according to results in the first short-circuit test and the second short-circuit test, and determines a signal path between the chips CHIP10 and CHIP20. For example, the selection units SELU10 and SELU20 select a terminal TM at which a signal is transmitted from a plurality of terminals TM according to results in the first short-circuit test and the second short-circuit test. Mutually short-circuited signal paths may be recovered.

Since, in the semiconductor device SEM2, the first short-circuit test and the second short-circuit test are executed for each redundant group, a time taken in short-circuit tests to bypass mutually short-circuited terminals TM may be shortened.

In a method of testing the semiconductor device SEM2 for a short circuit, processing that is substantially the same as or similar to operation S120 may be performed after, for example, operation S170. For example, after having executed the first short-circuit test for all redundant groups, the test apparatus may execute the second short-circuit test for all redundant groups.

Figure 5:
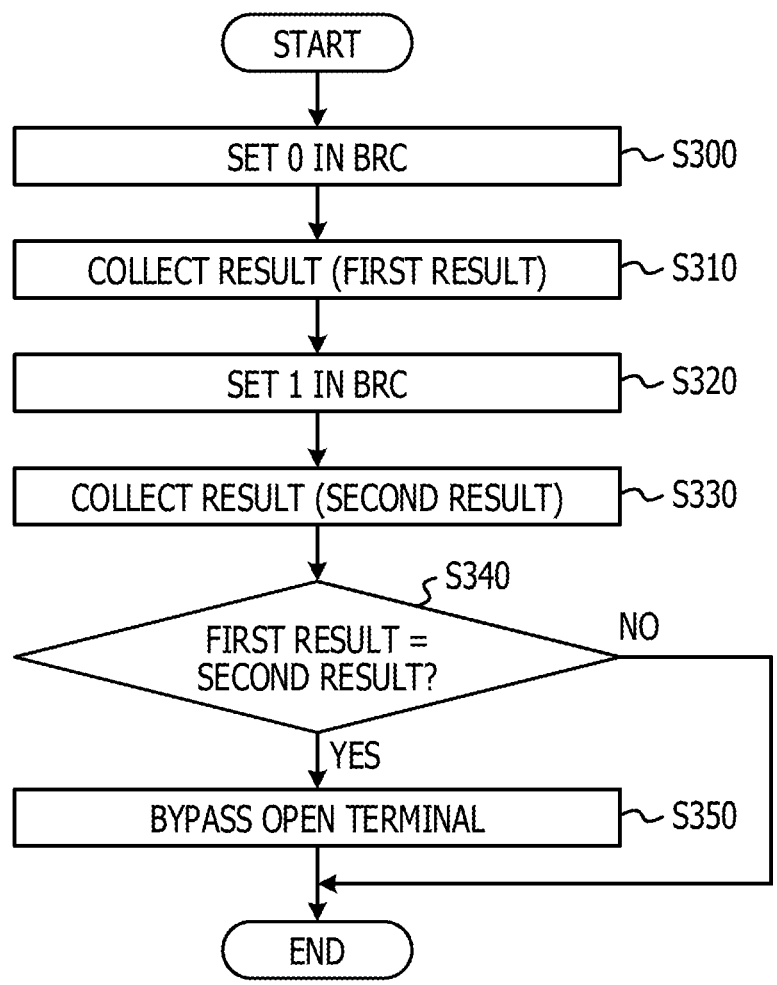
FIG. 5 illustrates an example of an open test for inter-chip signal paths.

FIG. 5 illustrates an example of an open test for inter-chip signal paths. In FIG. 5, an open test for signal paths between chips CHIP in the semiconductor device SEM2 in FIG. 2 is illustrated. The open test is, for example, a test to detect an open line from a plurality of lines that interconnect the chips CHIP10 and CHIP20, for example, bumps BP. The open test is executed by a test apparatus that tests the semiconductor device SEM2. Descriptions of processing substantially the same as or similar to processing in FIG. 4 may be omitted or reduced. In processing operations illustrated in FIG. 5, the buffer TBUF is maintained in the output state, which is a state other than the high-impedance state. The output terminal TM is maintained in a state in which it is coupled neither to the power supply line VDD nor to the ground line GND.

In operation S300, the test apparatus sets data of a logical value of 0 in all flip-flop circuits BRC (BRC10 to BRC13, BRC20 to BRC23, and the like). For example, data of a logical value of 0, which is held in the flip-flop circuit BRC, is forwarded to the output terminal TM of one chip CHIP of the chips CHIP10 and CHIP20. For example, data of a logical value of 0 is forwarded to the data input terminal D of the flip-flop circuit BRC corresponding to the input terminal TM of the other chip CHIP of the chips CHIP10 and CHIP20.

In operation S310, the test apparatus collects a test result, for example, a forwarding result in operation S300. For example, the test apparatus obtains data held in each flip-flop circuit BRC through a scan chain or the like. The test result collected in operation S310 may be referred to below as the first result.

In operation S320, the test apparatus sets data of a logical value of 1 in all flip-flop circuits BRC (BRC10 to BRC13, BRC20 to BRC23, and the like). For example, data of a logical value of 1, which is held in the flip-flop circuit BRC, is forwarded to the output terminal TM of one chip CHIP of the chips CHIP10 and CHIP20. For example, data of a logical value of 1 is forwarded to the data input terminal D of the flip-flop circuit BRC corresponding to the input terminal TM of the other chip CHIP of the chips CHIP10 and CHIP20.

In operation S330, the test apparatus collects a test result for example, a forwarding result in operation S320. For example, the test apparatus obtains data held in each flip-flop circuit BRC through a scan chain or the like. The test result collected in operation S330 may be referred to below as the second result.

In operation S340, the test apparatus decides whether there is a match between the test result collected in operation S310 (first result) and the test result collected in operation S330 (second result). For example, if a signal path is open, data that has been set in the flip-flop circuits BRC in operation S300 and S320 is not forwarded between the chips CHIP10 and CHIP20 through the signal path. Therefore, even if operations S300 and S320 are executed, data held in the flip-flop circuit BRC corresponding to the input terminal TM of a signal path in an open state remains unchanged. Therefore, if the signal path is open, there is a match between the first result and the second result.

If a signal path for which the first result and second result match is included (the result in operation S340 is Yes), the processing by the test apparatus proceeds to operation S350. If a signal path for which the first result and second result match is not included (the result in operation S340 is No), the test apparatus terminates the open test for the signal paths between the chips CHIP in the semiconductor device SEM2.

In operation S350, the test apparatus bypasses a signal path (terminals TM and bumps BP) for which the first result and second result match. Therefore, the open signal path is recovered.

In FIGS. 2 to 5, effects that are substantially the same as or similar to the effects obtained in FIGS. 1A and 1B may be obtained. For example, a plurality of signal paths, which includes terminals TM and the like, are divided into a plurality of redundant groups, and a plurality of terminals TM belonging to the same redundant group are placed at intervals larger than the interval β. The selection unit SELU is provided for each redundant group, and one output unit OU is provided for each output terminal TM, which is part of a plurality of terminals TM belonging to the redundant groups.

The test apparatus that tests the semiconductor device SEM2 executes the first short-circuit test and the second short-circuit test for each redundant group while controlling the output units OU and the like. When compared with a case in which the first short-circuit test and the second short-circuit test are executed for each terminal TM, a time taken in the short-circuit tests may be shortened. Therefore, the manufacturing cost of the semiconductor device may be reduced.

Each chip CHIP has a test output terminal TMDO from which data is output to the outside of the chip CHIP, and a test input terminal TMDI at which data is received from the outside of the chip CHIP. Data is forwarded from the test input terminal TMDI through a selector SEL in the selection unit SELU to the test output terminal TMDO, so the selector SEL in the selection unit SELU in each chip CHIP is tested with the chip CHIP being standalone.

While the normal mode is in progress, the flip-flop circuits BRC (BRC10 to BRC13, BRC20 to BRC23, and the like) are used as part of logic circuits that implement the functions of the relevant chip CHIP. Therefore, an increase in the circuit size of each CHIP may be reduced.

FIG. 6 illustrates an example of a semiconductor device. In FIG. 6, elements that are substantially the same as or similar to elements illustrated in FIGS. 1A and 1B to FIG. 5 may be assigned the same reference characters or similar reference characters and their detailed explanation may be omitted or reduced. The meanings of the suffixes a, b, and t of the terminals TM (TM10a, TM11t, TM15b, TM20a, TM21t, TM25b, and the like) and bumps BP (BP0a, BP1t, BP5b, and the like) illustrated in FIG. 6 are the same as or similar to the meanings of the suffixes in FIG. 2. In FIG. 6, selection units SELU and the like that correspond to redundant groups other than the redundant group As, for example, the redundant group B, may not be illustrated, as in FIG. 2. In the output units OU illustrated in FIG. 6, elements other than the buffer TBUF, for example, pull-up resistors RPU, pull-down resistors RPD, and switches SWU and SWD, may not be illustrated.

In the semiconductor device SEM3, selectors SELT (SELT0 to SELT3) are added to the semiconductor device SEM2 illustrated in FIG. 2. The destinations to which the data input terminal D and data output terminal Q of the flip-flop circuit BRC are coupled differ from the flip-flop circuit BRC in the semiconductor device SEM2 illustrated in FIG. 2. Other structures of the semiconductor device SEM3 may be substantially the same as or similar to the structures of the semiconductor device SEM2 illustrated in FIG. 2. The method of testing the semiconductor device SEM3 may be substantially the same as or similar to the test methods indicated in FIGS. 4 and 5.

The semiconductor device SEM3 may be a SiP in which a plurality of chips CHIP (CHIP12 and CHIP22) are included in a single package. For example, the semiconductor device SEM3 has a plurality of chips CHIP (CHIP12 and CHIP22) and bumps BP that mutually couple a plurality of terminals TM placed on certain planes of the plurality of chips CHIP. A certain number of terminals TM on each of the plurality of chips CHIP may belong to any one of a plurality of redundant groups.

The chip CHIP12 has flip-flop circuits RC (RC10 to RC12), the selection unit SELU10, flip-flop circuits BRC (BRC10 to BRC13), selectors SELT (SELT0 to SELT3), output units OU (OU10 to OU13), and terminals TM. The structures and operations of the flip-flop circuits RC, selection unit SELU10, and output units OU may be substantially the same as or similar to the structures and operations of the flip-flop circuits RC, selection unit SELU10, and output units OU illustrated in FIG. 2. Descriptions of the flip-flop circuits RC, selection unit SELU10, and output units OU may be omitted or reduced.

The selectors SELT (SELT0, SELT1, SELT2, and SELT3) may be an example of a test selection unit that receives data from the selection unit SELU10 and a flip-flop circuit BRC. One selector SELT is provided for each output terminal TM, which is part of a plurality of terminals TM belonging to the redundant groups and from which a signal is output to another chip CHIP, for example, the chip CHIP22.

For example, the selectors SELT0, SELT1, SELT2, and SELT3 are provided respectively for the terminals TM10a, TM12a, TM14a, and TM16a. Selection signals SST (SST0, SST1, SST2, and SST3) for the selectors SELT0, SELT1, SELT2, and SELT3 may be common to the selectors SELT0, SELT1, SELT2, and SELT3 or may be different from each other.

The two input terminals of the selector SELT0 are coupled to the data output terminal Q of the flip-flop circuit BRC10 and to the output of the selector SEL10 in the selection unit SELU10. The output of the selector SELT0 is coupled to the data input terminal D of the flip-flop circuit BRC10 and to the input of the buffer TBUF in the output unit OU10.

For example, the selector SELT0 receives data from the selector SEL10 in the selection unit SELU10 and from the flip-flop circuit BRC10. The selector SELT0 outputs one of a signal received from the flip-flop circuit BRC10 and a signal received from the selector SEL10, according to the selection signal SST0.

In a test for, for example, the selector SEL10 in the selection unit SELU10, the selector SELT0 outputs the data received from the selector SEL10 in the selection unit SELU10 to the data input terminal D of the flip-flop circuit BRC10. In a test for a connection between the chips CHIP12 and CHIP22, the selector SELT0 outputs the data received from the flip-flop circuit BRC10 to the buffer TBUF in the output unit OU10. While the normal mode is in progress, the selector SELT0 outputs the data received from the selector SEL10 in the selection unit SELU10 to the buffer TBUF in the output unit OU10.

The operations of the selectors SELT1, SELT2, and SELT3 may be substantially the same as or similar to the operation of the SELT0. For example, the two input terminals of the selector SELT1 are coupled to the data output terminal Q of the flip-flop circuit BRC11 and to the output of the selector SEL11 in the selection unit SELU10. The output of the selector SELT1 is coupled to the data input terminal D of the flip-flop circuit BRC11 and to the input of the buffer TBUF in the output unit OU11.

The two input terminals of the selector SELT2 are coupled to the data output terminal Q of the flip-flop circuit BRC12 and to the output of the selector SEL12 in the selection unit SELU10. The output of the selector SELT2 is coupled to the data input terminal D of the flip-flop circuit BRC12 and to the input of the buffer TBUF in the output unit OU12.

The two input terminals of the selector SELT3 are coupled to the data output terminal Q of the flip-flop circuit BRC13 and to the output of the selector SEL13 in the selection unit SELU10. The output of the selector SELT3 is coupled to the data input terminal D of the flip-flop circuit BRC13 and to the input of the buffer TBUF in the output unit OU13.

In a test for the selector SEL10 in the selection unit SELU10, the flip-flop circuit BRC10 forwards, to the test output terminal TMDO1, data received at the data input terminal D from the test input terminal TMDI1 through the selector SEL10 and selector SELT0. For example, while the scan mode is in progress, the scan flip-flop holds data to be forwarded from the test input terminal TMDI1 through a scan chain or the like. After having set to the non-scan mode, the scan flip-flop forwards the held data to the selector SEL10.

The flip-flop circuit BRC10 that is set to the non-scan mode receives the data forwarded from the test input terminal TMDI1 at the data input terminal D through the selector SEL10 and selector SELT0. The flip-flop circuit BRC10 holds the data received at the data input terminal D. After that, the flip-flop circuit BRC10 is set to the scan mode. Thus, the data held in the flip-flop circuit BRC10 is forwarded from the data output terminal Q of the flip-flop circuit BRC10 through a scan chain or the like to the test output terminal TMDO1.

Whether both the selector SEL10 in the selection unit SELU10 and the selector SELT0 are normal is determined by comparing the data forwarded to the test output terminal TMDO1 with an expected value. Before the chip CHIP12 and chip CHIP22 are coupled, each selector SEL in the selection unit SELU10 and each selector SELT are tested with the chip CHIP12 being standalone.

In a test for a connection between the chips CHIP12 and CHIP22, the flip-flop circuit BRC10 outputs the data received at the scan input terminal SI to the buffer TBUF in the output unit OU10 through the selector SELT0. For example, while the scan mode is in progress, the flip-flop circuit BRC10 holds data to be forwarded through a scan chain or the like. After having held the data, the flip-flop circuit BRC10 is set to the non-scan mode, the flip-flop circuit BRC10 in the non-scan mode outputs the held data to the buffer TBUF in the output unit OU10 through the selector SELT0.

While the chip CHIP12 is in the normal mode, the selector SELT0 does not output the signal received from the flip-flop circuit BRC10. Therefore, the flip-flop circuit BRC10 may not affect the operations of the logic circuits that execute the functions of the chip CHIP12. The structures and operations of the flip-flop circuits BRC11, BRC12, and BRC13 may be substantially the same as or similar to the structure and operation of the flip-flop circuit BRC10.

The chip CHIP22 has flip-flop circuits RC (RC20 to RC22), flip-flop circuits BRC (BRC20 to BRC23), the selection unit SELU20, and terminals TM. The structures and operations of the flip-flop circuits RC and selection unit SELU20 may be substantially the same as or similar to the structures and operations of the flip-flop circuits RC and selection unit SELU20 illustrated in FIG. 2. Descriptions of the flip-flop circuits RC and selection unit SELU20 may be omitted or reduced.

The data input terminal D of the flip-flop circuit BRC20 is coupled to the terminal TM20a. The data output terminal Q of the flip-flop circuit BRC20 may not be coupled to the selection unit SELU20. Therefore, the flip-flop circuit BRC20 may not affect the operations of the logic circuits that execute the functions of the chip CHIP22. As in FIG. 2, the output terminal Q of the flip-flop circuit BRC is coupled the scan input terminal SI of the succeeding flip-flop circuit BRC in the scan chain.

For example, in a test for a connection between the chips CHIP12 and CHIP22, the flip-flop circuit BRC20 is first set to the non-scan mode. The flip-flop circuit BRC20 receives data that has been forwarded to the terminal TM10a of the chip CHIP12 at the data input terminal D through the bump BP0a and terminal TM20a.

The flip-flop circuits BRC 20 holds the data that it has received at the data input terminal D, for example, data forwarded from the chip CHIP10, in synchronization with a clock. Then, the flip-flop circuit BRC20 is set to the scan mode. The data held in the flip-flop circuit BRC20 is output from the data output terminal Q of the flip-flop circuit BRC20 to the outside of the semiconductor device SEM3 through a scan chain or the like.

The structures and operations of the flip-flop circuits BRC21, BRC22, and BRC23 may be substantially the same as or similar to the structure and operation of the flip-flop circuit BRC20. For example, the data input terminals D of the flip-flop circuit BRC21, BRC22, and BRC23 are respectively coupled to the terminals TM22a, TM24a, and TM26a.

Since the data output terminals Q of the flip-flop circuits BRC20, BRC21, BRC22, and BRC23 are not coupled to the selection unit SELU20, the destinations to which the input terminals of each selector SEL in the selection unit SELU20 are coupled differs from the input terminal of each selector SEL in the selection unit SELU20 illustrated in FIG. 2. For example, the two input terminals of the selector SEL20 are coupled to the terminals TM20a and TM22a, respectively. The two input terminals of the selector SEL21 are coupled to the terminals TM22a and TM24a, respectively. The two input terminals of the selector SEL22 are coupled to the terminals TM24a and TM26a, respectively.

Each selector SEL in the selection unit SELU is tested with the chip CHIP22 being standalone, as with the chip CHIP20 illustrated in FIG. 2. In a test for each selector SEL in selection unit SELU20 in FIG. 6, scan flip-flops different from the flip-flop circuits BRC20 to BRC23 forward data from the test input terminal TMDI2 through a scan chain or the like to the selection unit SELU20.

In the structure of the semiconductor device SEM3, if, for example, the chip CHIP22 has output terminals TM, which are part of a plurality of terminals TM belonging to the redundant groups, the chip CHIP22 may have output units OU and the like. In a test for each selector SEL in the selection unit SELU20, for example, scan flip-flops other than the flip-flop circuits BRC20 to BRC23 and the like may forward data from the test input terminal TMDI2 through a scan chain or the like to the selection unit SELU20. The flip-flop circuits RC and the like may be replaced with scan flip-flops. The semiconductor device SEM3 may have test circuits that execute tests illustrated in, for example, FIGS. 4 and 5.

In FIG. 6, effects similar to the effects obtained in FIGS. 1A and 1B may be obtained. For example, the manufacturing cost of the semiconductor device may be reduced. Since the flip-flop circuits BRC do not affect the logic circuits that implement the function of each chip CHIP, the logic of each chip CHIP may be easily designed.

FIG. 7 illustrates an example of a semiconductor device. In FIG. 7, elements that are substantially the same as or similar to elements illustrated in FIGS. 1A and 1B to FIG. 6 may be assigned the same reference characters or similar reference characters and their detailed explanation may be omitted or reduced. The meanings of the suffixes a, b, c, and t of the terminals TM (TM10a, TM11t, TM15b, TM17c, TM20a, TM21t, TM25b, TM27c, and the like) and bumps BP (BP0a, BP1t, BP5b, BP7c, and the like) illustrated in FIG. 7 are the same as or similar to the meanings of the suffixes in FIG. 2. For example, terminals TM17c, TM19c, TM27c, and TM29c, and bumps BP7c and BP9c belong to a group C other than the first groups. The group C is a group in which signal paths through which a clock signal is transmitted are redundant. In the description below, a signal path through which a clock signal is transmitted may be referred to as a clock path.

In FIG. 7, selection units SELU and the like that correspond to redundant groups other than the redundant group A, for example, the redundant group B, may not be illustrated, as in FIG. 2. In the semiconductor device SEM4, buffers TBUFC (TBUFC1 and TBUFC2) and a selector SELCK are added to the semiconductor device SEM2 illustrated in FIG. 2. Other structures of the semiconductor device SEM4 may be substantially the same as or similar to the structures of the semiconductor device SEM2 illustrated in FIG. 2. A short-circuit test and an open test for signal paths between the chips CHIP in the semiconductor device SEM4 may be substantially the same as or similar to the test methods indicated in FIGS. 4 and 5.

The semiconductor device SEM4 may be a SiP in which a plurality of chips CHIP (CHIP14 and CHIP24) are included in a single package. For example, the semiconductor device SEM4 has a plurality of chips CHIP (CHIP14 and CHIP24) and bumps BP that mutually couple a plurality of terminals TM placed on certain planes of the plurality of chips CHIP. A certain number of terminals TM on each of the plurality of chips CHIP may belong to any one of a plurality of redundant groups.

The chip CHIP14 has flip-flop circuits RC (RC10 to RC12), the selection unit SELU10, flip-flop circuits BRC (BRC10 to BRC13), output units OU (OU10 to OU13), buffers TBUFC1 and TBUFC2, and terminals TM. The structures and operations of the flip-flop circuits RC, selection unit SELU10, flip-flop circuits BRC, and output units OU may be substantially the same as or similar to the structures and operations of the flip-flop circuits RC, selection unit SELU10, flip-flop circuits BRC, and output units OU illustrated in FIG. 2. Therefore, descriptions of the flip-flop circuits RC, selection unit SELU10, flip-flop circuits BRC, and output units OU may be omitted or reduced.

The terminals TM17c and TM19c are two of terminals other than a certain number of terminals TM, for example, terminals TM belonging to any of a plurality of redundant groups; the terminals TM17c and TM19c are each a clock output terminal from which a clock signal is output. The clock output terminals TM17c and TM19c are placed at, for example, an interval larger than the interval β.

A circuit that includes the buffers TBUFC1 and TBUFC2 may be an example of a clock buffer that outputs a clock signal from one of the clock output terminals TM17c and TM19c and places the other of the clock output terminals TM17c and TM19c in the high-impedance state. The buffers TBUFC1 and TBUFC2 may be each a three-state buffer that makes a switchover to output a signal according to an input signal or to set an output to a high-impedance.

For example, the input terminals of buffers TBUFC1 and TBUFC2 are coupled to a signal line WLCK10, through which a clock signal is transmitted. Therefore, the buffers TBUFC1 and TBUFC2 each receive a clock signal through the signal line WLCK10. The output terminal of the buffer TBUFC1 is coupled to the clock output terminal TM17c, and the output terminal of the buffer TBUFC2 is coupled to the clock output terminal TM19c.

The buffers TBUFC1 and TBUFC2 are placed in mutually different states. In FIG. 7, the buffers TBUFC1 and TBUFC2 are controlled by the same control signal CTLCK; the buffer TBUFC1 is controlled in a negative logic, and the buffer TBUFC2 is controlled in a positive logic.

If, for example, the buffer TBUFC2 is set to the high-impedance state, the buffer TBUFC1 outputs a clock signal received through the signal line WLCK10 to the clock output terminal TM17c. If the buffer TBUFC1 is set to the high-impedance state, the buffer TBUFC2 outputs a clock signal received through the signal line WLCK10 to the clock output terminal TM19c.

The chip CHIP24 has flip-flop circuits RC (RC20 to RC22), the selection unit SELU20, flip-flop circuits BRC (BRC20 to BRC23), the selector SELCK, and terminals TM. The structures and operations of the flip-flop circuits RC, selection unit SELU20, and flip-flop circuits BRC may be substantially the same as or similar to the structures and operations of the flip-flop circuits RC, selection unit SELU20, and flip-flop circuits BRC illustrated in FIG. 2. Therefore, descriptions of the flip-flop circuits RC, selection unit SELU20, and flip-flop circuits BRC may be omitted or reduced.

The terminals TM27c and TM29c are two of terminals other than a certain number of terminals TM, for example, terminals TM belonging to any of a plurality of redundant groups; the terminals TM27c and TM29c are each a clock input terminal that receives a clock signal. For example, the terminals TM27c and TM29c are respectively coupled to the clock output terminals TM17c and TM19c through the bumps BP7c and BP9c. For example, the terminal TM27c is a clock input terminal corresponding to the clock output terminal TM17c and the terminal TM29c is a clock input terminal corresponding to the clock output terminal TM19c. The clock input terminals TM27c and TM29c are placed at, for example, an interval larger than the interval β.

The two input terminals of the selector SELCK are coupled to the clock input terminals TM27c and TM29c, respectively. The output terminal of the selector SELCK is coupled to a signal line WLCK20, through which a clock signal is transmitted. The selector SELCK selects one of the clock input terminals TM27c and TM29c. For example, the selector SELCK outputs one of a clock signal received from the clock input terminal TM27c and a clock signal received from the clock input terminal TM29c to the signal line WLCK20 according to a selection signal SSCK. A clock that has been forwarded from the chip CHIP14 to the chip CHIP24 is forwarded to the inside of the chip CHIP24.

If, for example, the bumps BP7c and BP8b are short-circuited or there is an open between the terminals TM17c and TM27c, the buffer TBUFC1 is set to the high-impedance state and the selector SELCK selects the clock input terminal TM29c. In this case, the buffer TBUFC2 outputs the clock signal received through the signal line WLCK10 to the clock output terminal TM19c. The selector SELCK outputs the clock signal received from the clock output terminal TM19c through the bump BP9c and clock input terminal TM29c to the signal line WLCK20.

If a clock path including the clock output terminal 17c is faulty, a clock path including the terminal TM19c, bump BP9c, terminal TM29c, and the like is selected as a clock path between the signal lines WLCK10 and WLCK20.

If, for example, a clock path including the clock output terminal 19c is faulty, a clock path including the terminal TM17c, bump BP7c, terminal TM27c, and the like is selected as a clock path between the signal lines WLCK10 and WLCK20. With the semiconductor device SEM4, even if a clock path failure occurs, a clock path between the chips CHIP14 and CHIP24 is recovered.

With the semiconductor device SEM4, the buffers TBUFC (TBUFC1 and TBUFC2) and selector SELCK, for example, may be provided for all clock signals used in the semiconductor device SEM4. The buffers TBUFC (TBUFC1 and TBUFC2) and selector SELCK may be provided for arbitrary clock signals of all clock signals used in the semiconductor device SEM4. The buffers TBUFC (TBUFC1 and TBUFC2) and selector SELCK may be added to the semiconductor device SEM3 illustrated in FIG. 6.

Figure 8:
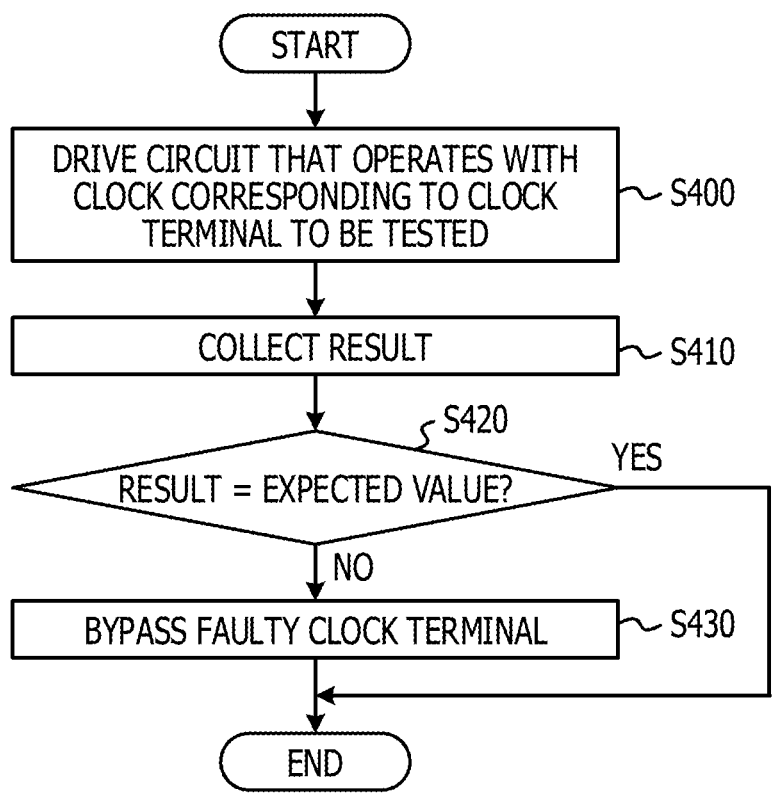
FIG. 8 illustrates an example of a method of testing a clock terminal.

The semiconductor device SEM4 may have test circuits that execute tests illustrated in, for example, FIGS. 4 and 5 or may have a test circuit that executes a test illustrated in FIG. 8.

FIG. 8 illustrates an example of a method of testing a clock terminal. In FIG. 8, a method of testing a clock terminal TM in the semiconductor device SEM4 illustrated in FIG. 7 is illustrated. The clock terminal test may be a test for detecting a failure in the clock path between the chips CHIP14 and CHIP24. The clock terminal test may be executed by a test apparatus that tests the semiconductor device SEM4.

In operation S400, the test apparatus drives, in the normal mode, a circuit that operates with a clock corresponding to a clock terminal TM to be tested. If the circuit operates in synchronization with the clock, certain data is held in a scan flip-flop. If, for example, a clock path including the clock terminal TM to be tested is faulty, the circuit does not operate, so the certain data may not be forwarded to the scan flip-flop.

In operation S410, the test apparatus collects an execution result obtained in operation S400. For example, the test apparatus obtains data held in the scan flip-flop through a scan chain or the like.

In operation S420, the test apparatus decides whether the result collected in operation S410 matches an expected value. If there is a match between the result and the expected value (the result in operation S420 is Yes), the test apparatus terminates the test for the clock terminal TM in the semiconductor device SEM4. If there is no match between the result and the expected value (the result in operation S420 is No), the operation of the test apparatus proceeds to operation S430.

In operation S430, the test apparatus bypasses the faulty clock path by selecting another clock terminal TM to be used. The faulty clock path may be recovered.

In FIGS. 7 and 8, effects that are substantially the same as or similar to the effects obtained in FIG. 2 may be obtained. For example, the manufacturing cost of the semiconductor device may be reduced. Since clock terminals TM are redundant, even if a failure occurs in a clock path, a clock path between the chips CHIP is recovered.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising a plurality of chips, each of the plurality of chips includes a plurality of terminals coupled with connection members, wherein
a first chip of the plurality of chips includes:
an internal circuit;
a plurality of first selectors configured to output signals from the internal circuit from one of a plurality of first outputs;
a plurality of second selectors configured to output signals from the internal circuit from one of a plurality of second outputs;
a plurality of first output buffer units configured to relay or interrupt signals output from one of the plurality of first outputs;
a plurality of second output buffer units configured to relay or interrupt signals output from one of the plurality of second outputs;
a plurality of first terminals configured to output a signal from the respective plurality of first output buffer units and belong to a first group in which the first terminals are placed at positions distant from each other by first distances; and
a plurality of second terminals configured to output a signal from the respective plurality of second output buffer units and belong to a second group in which the second terminals are placed at positions distant from each other by second distances and each of the second terminals is placed at a position distant from an adjacent first terminal of the first terminals by third distances smaller than the first distances.

2. The semiconductor device according to claim 1, wherein the plurality of first chip includes:
a test output terminal configured to output data to an outside of the first chip;
a test input terminal configured to receive data from the outside of the first chip; and
a plurality of holding units, provided between the respective first selectors and the respective first output buffer units, configured to forward data, which is received at respective data input terminals of the plurality of holding units from the test input terminal through the first selectors, to the test output terminal through a scan chain which couples the plurality of holding units when testing the plurality of first selectors, and forward data received at respective plurality of scan input terminals of the plurality of holding units to the plurality of first output buffer units through the scan chain when testing connection between the plurality of chips.

3. The semiconductor device according to claim 2, wherein, during a normal operation, the plurality of holding units forward data, which is received at the respective data input terminals of the plurality of holding units from a specific circuit in the internal circuit through the plurality of first selectors to the plurality of first output buffer units.

4. The semiconductor device according to claim 2, wherein the first chip includes:
a plurality of test selectors configured to receive data from the plurality of first selectors and the plurality of holding units, output the data from the plurality of first selectors to the respective plurality of data input terminals of the plurality of holding units when testing the plurality of first selectors, and output the data from the plurality of holding units to the plurality of first output buffer units when testing connection between the plurality of chips, and output the data from the plurality of first selectors to the plurality of first output buffer units during a normal operation, and
the plurality of holding units configured to forward data, which is received at the respective plurality of data input terminals of the plurality of holding units from the test input terminal through the plurality of first selectors and the plurality of test selectors, to the test output terminal through the scan chain when testing the plurality of first selectors, and forward data received at the respective plurality of scan input terminals of the plurality of holding units to the plurality of first output buffer units through the plurality of test selectors when testing connection between the plurality of chips.

5. The semiconductor device according to claim 1, wherein the first chip includes:
two clock output terminals configured to output clock signals; and
a clock buffer configured to output the clock signal from one of the two clock output terminals and set the other of the two clock output terminals to a high-impedance state,
wherein a second chip, included in the plurality of chips, configured to receive the clock signal from one of the two clock output terminals, the second chip including:
two clock input terminals corresponding to the respective two clock output terminals; and
a clock selector configured to select one of the two clock input terminals.

6. A method of testing a semiconductor device, comprising:
testing the semiconductor including a plurality of chips, each of the plurality of chips having a plurality of terminals coupled with connection members,
wherein a first chip of the plurality of chips includes:
an internal circuit;
a plurality of first selectors configured to output signals from the internal circuit from one of a plurality of first outputs;
a plurality of second selectors configured to output signals from the internal circuit from one of a plurality of second outputs;
a plurality of first output buffer units configured to relay or interrupt signals output from one of the plurality of first outputs;
a plurality of second output buffer units configured to relay or interrupt signals output from one of the plurality of second outputs;
a plurality of first terminals configured to output a signal from the respective plurality of first output buffer units and belong to a first group in which the plurality of first terminals are placed at positions distant from each other by first distances; and
a plurality of second terminals configured to output a signal from the respective plurality of second output buffer units and belong to a second group in which the plurality of second terminals are placed at positions distant from each other by second distances and each of the second plurality of terminals is placed at a position distant from an adjacent first terminal of the plurality of first terminals by third distances smaller than the first distances,
wherein the testing is performed by a first test unit which tests the semiconductor device with operations of:
setting, to an interrupt state, the plurality of first output buffer units;
setting, to a relay state, the plurality of second output buffer units;
executing a first test in which data at a first level corresponding to a ground voltage is forwarded to a plurality of signal paths corresponding to the second group;
executing a second test in which data at a second level corresponding to a power supply voltage is forwarded to the plurality of signal paths corresponding to the second group; and
selecting a terminal at which a signal is transmitted from the plurality of first terminals by controlling the plurality of first selectors based on a result in the first test and a result in the second test.

7. The method according to claim 6, wherein a second test unit which tests each of the plurality of chips performs operations of:
transmitting data, which is transmitted to a plurality of holding units from a test input terminal of a plurality of external terminals of each of the plurality of chips through the plurality of first selectors, to a test output terminal of the plurality of external terminals through a scan chain that couples the plurality of holding units; and
detecting whether the plurality of first selectors is normal according to the data transmitted to the test output terminal.

* * * * *